United States Patent [19]

Tanizaki et al.

[11] Patent Number: 5,896,328
[45] Date of Patent: Apr. 20, 1999

[54] SEMICONDUCTOR MEMORY DEVICE ALLOWING WRITING OF DESIRED DATA TO A STORAGE NODE OF A DEFECTIVE MEMORY CELL

[75] Inventors: Tetsushi Tanizaki; Masaki Tsukude, both of Hyogo, Japan

[73] Assignee: Mitsubishi Denki Kabushiki Kaisha, Tokyo, Japan

[21] Appl. No.: 09/031,556

[22] Filed: Feb. 27, 1998

[30] Foreign Application Priority Data

Sep. 10, 1997 [JP] Japan .................. H9-245759

[51] Int. Cl.$^6$ ............................................. G11C 7/00
[52] U.S. Cl. ..................... 365/200; 365/203; 365/225.7
[58] Field of Search ........................... 365/200, 203, 365/225.7, 189.09

[56] References Cited

U.S. PATENT DOCUMENTS 5,666,315  9/1997  Tsukude et al. ............... 365/200
5,768,206  6/1998  McClure ..................... 365/200

FOREIGN PATENT DOCUMENTS 5-128899  5/1993  Japan .
6-231595  8/1994  Japan .
8-180699  7/1996  Japan .

Primary Examiner—Vu A. Le
Attorney, Agent, or Firm—McDermott, Will & Emery

[57] ABSTRACT

In a defective cell write mode, a precharge potential generating circuit generates a precharge potential at a high level or a low level in accordance with an external control signal, and applies the potential to a bit line pair. Parallel to a fuse element provided between a main bit line precharge potential supply line and a sub bit line precharge potential supply line and is cut when a column is replaced by a redundancy column of memory cells, a pass transistor which is rendered conductive in the defective cell write mode is provided.

12 Claims, 17 Drawing Sheets

SEMICONDUCTOR MEMORY DEVICE ALLOWING WRITING OF DESIRED DATA TO A STORAGE NODE OF A DEFECTIVE MEMORY CELL

BACKGROUND OF THE INVENTION

1. Field of the Invention

The present invention relates to a semiconductor memory device and, more specifically, to a semiconductor memory device having a defective cell write mode.

2. Description of the Background Art

As the degree of integration of semiconductor memory devices, particularly of dynamic RAMs (DRAMs) increases, power consumption in a standby state is ever increasing. Particularly in a DRAM, stored information is retained by re-reading/re-writing of stored information even in the standby state. Therefore, there is a limit in reducing the power consumption in the standby state in principle.

However, it is a critical issue to reduce as much as possible, the power consumption in the standby state in a system that uses a large number of DRAMs.

Increase in the degree of integration inevitably leads to increased possibility of defects in memory cells. In order to compensate for generation of error due to such defective memory cell, an approach by a so-called redundancy circuit is made where a column of memory cell including a defective memory cell is replaced by a spare column of memory cells, for example.

Such replacement allows the basic operation of reading/writing of data of a memory cell without any problem. However, even when the defect is repaired by the redundancy circuit, there still remains a leakage path at the defective portion. This means that the power consumption in the standby state of the DRAM is further increased.

The above circumstance will be described in detail with reference to FIG. 12.

The operation of each component will be described briefly.

In a Y address comparator circuit 6038 in a redundancy column decoder 6023, an address detected as including a defective bit at a time of previous testing is stored, in a nonvolatile memory such as a fuse circuit.

When an external address signal A0–Ai does not match the above identified address including the defective bit, a column selection line drive circuit 6034, for example, is activated, whereby a column selection line (hereinafter referred to as "CS line") 6024 is pulled up to an "H" level (logical high).

By an I/O gate 6018 of a bit line pair group unit 6102, for example, a pair of bit lines BL3, /BL3 is connected to a data input/output line 6020.

Potential difference between the pair of bit lines BL3 and /BL3 is amplified by a sense amplifier 6016 in accordance with the information stored in a memory cell connected thereto and selected by a signal of a word line, not shown.

By the above operation, the information of the memory cell is externally read out.

If there is a short-circuit portion 6200 between a bit line BL1 and the ground level GND, data cannot be read/written from and to the memory cell connected to that bit line.

In this case, the defective bit line is replaced by a spare bit line. Generally, this replacement is on a bit line by bit line basis or on unit by unit basis of the bit line pair group selected by a CS line.

More specifically, the address of CS line 6022 corresponding to the bit line pair group unit 6100 to which the defective bit line BL belongs is preprogrammed in a Y address comparator circuit 6038.

Externally applied address signal A0–Ai is compared with the programmed address of the defect by Y address comparator circuit 6038. When the two match each other, a signal (SE signal) activating a spare column decoder is input to a CS line drive circuit 6036, and a bit line pair group unit 6104 including spare bit lines SPARE BL1, SPARE /BL1 is selected.

At the same time, a signal (NED signal) inactivating the CS line associated with the defective bit line BL1 is input to a CS line drive circuit 6032.

Thus, defective bit is replaced and there is no problem in the basic operation of the memory cell.

However, the bit line pair is precharged to the level of a potential $V_{BL}$ generated by a bit line potential generating circuit (not shown) in the chip, for example, before sense amplifier 6016 starts amplifying operation in accordance with the information of the memory cell. Here, potential $V_{BL}$ is set to ½Vcc where Vcc represents the potential supplied from a power supply 6002.

Further, a first power supply line S2P to the sense amplifier connected through a switching transistor 6016 to power supply 6002 as well as a second power supply line S2N to the sense amplifier connected to the ground through switching transistor 6012 (hereinafter the power supply lines will be generally referred to as S2 line) are also precharged, similar to the bit line pair.

Therefore, a first leakage current path 6202 through which current leaks from the supply line of the potential of the bit line potential generating circuit through a bit line equalize circuit 6104 setting bit lines BL1 and /BL1 commonly to the potential $V_{BL}$ and through bit line BL1, and a second leak path 6204 through which current leaks from a S2 line equalize circuit 6008 setting S2 lines commonly to the potential $V_{BL}$ through the S2 line, sense amplifier 6016 and bit line BL1 are generated because of the existence of the short-circuit portion 6200.

As a result, a problem arises that the actual standby current at the memory cell portion increases.

Further, since the potential $V_{BL}$ attains lower than the designed value, operation margin with respect to $V_{BL}$ is significantly reduced. This will be described with reference to a timing chart of FIG. 13 showing the operation of the conventional DRAM.

First, at time $t_0$, all the pairs of bit lines should be precharged to the level of potential $V_{BL}$.

However, the potential of bit line pair BL1, /BL1 associated with the defective bit is lower than the potential $V_{BL}$ (½Vcc) because of the leakage current.

Line S2 of the sense amplifier is also lower than precharge voltage $V_{BL}$, because of the leakage current. It is to be noted that reduction in potential of line S2 influences the operation of all the sense amplifiers commonly connected to line S2.

Following the transition of row address strobe signal /RAS from high ("H") to low ("L") at time $t_2$, an internal signal BLEQ makes a transition from high to low at time $t_3$, and the bit line pair is electrically isolated.

Similarly, S2 line equalize circuit 6008 is turned off, whereby the pair of lines S2 is electrically isolated.

Thereafter, at time t5, switching transistors 6010 and 6012 are turned on in response to signals /SOP and SON, respectively, and sense amplifier 6016 is activated.

As a result, potential of one of the paired bit lines BL1 and /BL1 and one of paired spare bit lines SPARE BL1 and SPARE /BL1 attains to the potential Vcc, and the potential of the other one of the paired line attains to the ground potential, in accordance with the information stored in the memory cell selected corresponding thereto. At time $t_8$, at the transition of signals NED and SE from low to high, CS1 line 6022 is kept inactive while spare CS line 6026 is activated, and as a result, data is output to data input/output line (I/O line) 6020.

Thereafter, at time $t_{12}$, signal /RAS makes a transition from low to high, and at time $t_{13}$, the BLEQ signal makes a transition from low to high.

At the same time, the sense amplifier attains an inactive state by signals /SOP and SON. By the BLEQ signal, the bit line pair is again precharged to the potential $V_{BL}$. However the potential of bit line pair BL1 and /BL1 lowers because of the leakage current, and the potential of S2 line also lowers.

As described above, the potential of S2 line immediately before activation of the sense amplifier is lower than $V_{BL}$ (=½Vcc) because of the leakage current. The resulting lower $V_{BL}$ would present more severe problem as the capacity of memories has been increased recently.

Increase in memory capacity and miniaturization of the device size require reduction in power supply voltage, from the stand point of reliability. Therefore, the problem of lower $V_{BL}$ margin caused by the reduction in voltage is further aggravated by the reduction of $V_{BL}$ due to leakage path.

As described above, the conventional semiconductor memory device suffers from a first problem that actual standby current of the memory cell portion is increased because of the leakage current at a defective portion and that operation margin with respect to the potential $V_{BL}$ is reduced.

Further, the conventional semiconductor memory device suffers from a second problem, which will be described in the following.

FIG. 14 is a partially omitted circuit block diagram showing a structure of a conventional DRAM and FIG. 15 is a partially omitted circuit block diagram showing, in detail, a structure of one column of memory cells shown in FIG. 14.

Referring to FIGS. 14 and 15, a memory cell array 6050 includes a plurality of memory cells MC arranged in a matrix, word lines WL provided corresponding to respective rows, and pairs of bit lines BL, /BL provided corresponding to respective columns.

Each memory cell MC is connected to the word line WL of the corresponding row. A plurality of memory cells MC of odd-numbered columns are connected to bit line BL or /BL alternately.

A plurality of memory cells of even-numbered columns are connected to bit line /BL or BL alternately.

Each memory cell MC includes an N channel MOS transistor 50 for accessing, and a capacitor 51 for storing information. N channel MOS transistor 50 of each memory cell MC has its gate connected to the word line WL of the corresponding row. N channel MOS transistor 50 is connected between the bit line BL or /BL of the corresponding column and one electrode (storage node SN) of capacitor 51 of the memory cell MC. Capacitor 51 of each memory cell MC receives, at the other electrode, a cell potential Vcp. The word line WL transmits an output from a row decoder 6020 and activates memory cells MC of the selected row. Bit line pair BL, /BL allows input/output of data signal to and from the selected memory cell MC.

A redundancy memory cell array 6052 has similar structure as memory cell array 6050 except that the number of columns is smaller than that of memory cell array 6050. Memory cell array 6050 and redundancy memory cell array 6052 have the same number of rows, and word lines WL are shared by memory cell array 6050 and redundancy memory cell array 6052.

A sense amplifier+input/output control circuit 6054 includes a column selection gate 6018, a sense amplifier 6016 and an equalizer 6014 which are provided corresponding to each column, and an intermediate potential generating circuit 6040 provided common to all the columns. Each column selection gate 6018 includes N channel MOS transistors 41 and 42 connected between bit lines BL and /BL and data signal input/output lines IO and /IO, respectively. N channel MOS transistors 41 and 42 have their gates connected to column decoder 6023a or 6023b through column selection line CSL. When column selection line CSL is pulled up to the high ("H") level, which is the selected level, by column decoder 6023a or 6023b, N channel MOS transistor 41 or 42 is rendered conductive and bit line pair BL, /BL is coupled to data signal input/output line pair IO, /IO.

Sense amplifier 6016 includes P channel MOS transistors 43 and 44 connected between a node N32 and bit lines BL and /BL, respectively, and N channel MOS transistors 45 and 46 connected between a node N32' and bit lines BL and /BL, respectively. MOS transistors 43 and 45 have their gates connected together to bit line /BL, while transistors 44 and 46 have their gates connected together to bit line BL. Nodes N32 and N32' receive sense amplifier activating signals SON and /SOP output from a clock generating circuit (not shown), respectively. Sense amplifier 6016 amplifies small potential difference between the pair of bit lines BL and /BL to power supply voltage Vcc, in response to sense amplifier activating signals SON and /SOP which have attained to "H" and "L" levels, respectively.

Equalizer 6014 includes an N channel MOS transistor 47 connected between bit lines BL and /BL, and N channel MOS transistors 48 and 49 connected between a node N33' and bit lines BL and /BL, respectively. N channel MOS transistors 47–49 have their gates connected to node N33. Node N33 receives a bit line equalize signal BLEQ, and node N33' receives a bit line potential VBL (=Vcc/2). Equalizer 6014 equalizes potentials of bit lines BL and /BL to bit line potential VBL in response to bit line equalize signal BLEQ which have attained to the active level of "H".

Intermediate potential generating circuit 6040 generates an intermediate potential Vcc/2 between power supply potential Vcc and ground potential GND, and outputs the generated intermediate potential Vcc/2 as bit line potential VBL.

Now, in such a DRAM, even when a defective memory cell is replaced by a redundancy memory cell MC, a normal memory cell near the defective memory cell MC may be affected by the defective memory cell and fails, dependent on the state of defective memory cell MC.

More specifically, referring to FIG. 16, a DRAM is formed on a surface of a p type silicon substrate 52. A gate electrode, that is, the word line WL is formed above the surface of p type silicon substrate 52 with a gate oxide film (not shown) interposed, and on the surface of silicon substrate 52 on both sides of word line WL, $n^+$ source/drain regions 53 are formed, thus providing N channel MOS transistor 50 of memory cell MC. One of the source/drain regions 53 of N channel MOS transistor 50 is connected to bit line BL, and on the surface of the other one of the source/drain regions, a conductive layer 54, a dielectric layer 55 and a conductive layer 56 are stacked, thus providing capacitor 51 of memory cell MC. Conductive layer 54 serves as one electrode of capacitor 51, that is, a storage node SN, and conductive layer 56 serves as the other electrode of capacitor. Three memory cells MC1 to MC3 are formed in the figure.

Now, assume that there is a small conductive particle between the gate electrode of the central memory cell MC2, that is, word line WL2, and silicon substrate 52. Further, it is assumed that the particle is small enough to allow data writing though memory cell MC2 is defective, and that word line WL2 is driven in the normal manner.

In a state where "L" level is written at storage node SN of defective memory cell MC2 and "H" level is written in storage node SN of normal memory cell MC1, when word line WL2 corresponding to memory cell MC2 is pulled up to the "H" level, positive charges (holes) are introduced from word line WL2 to silicon substrate 52 through the particle. Because of this positive charges, silicon substrate 52 locally attains to positive potential, and a PN junction between the portion having the positive potential and storage node SN of memory cell MC2 is forward biased. Accordingly, negative charges (electrons) flow out from storage node SN which is at the "L" level to silicon substrate 52. The negative charges move even to the storage node SN which is at the "H" level of adjacent memory cell MC1, pulling down the storage node SN to "L" level.

Therefore, even when the defective memory cell MC is replaced by a normal memory cell MC of redundancy memory cell array 6052, DRAM may not operate properly because of possible failure of a memory cell MC near the defective memory cell MC.

It is possible to detect the defect such as described above by a test in which "L" level is written to the storage node SN of defective memory cell MC and "H" level is written to storage nodes SN of other normal memory cells MC, a word line corresponding to the defective memory cell is pulled up to "H" and data of normal memory cells MC are read thereafter. If the storage nodes SN of the normal memory cells MC are at the "H" level, it is determined that the device has passed the test, and if the storage node SN of a normal memory cell MC is inverted to the "L" level, it is determined that the device fails.

However, in the conventional DRAM, it is not possible to access the defective memory cell MC which has been replaced by the redundancy memory cell MC. Therefore, it is not possible to write "L" level to the storage node SN of the replaced defective memory cell MC.

Further, as shown in FIG. 14, since a plurality of memory cells MC of respective columns are connected to bit line BL or /BL alternately, it is necessary to switch logic levels to be applied to bit lines BL and /BL in accordance with the address of the memory cell MC even when the same logic level is to be written to the storage nodes SN of the memory cells MC. Therefore, writing of a logic level to the storage node SN of each memory cell MC has been difficult. Especially when a defective memory cell MC is replaced by a redundancy memory cell MC, there may be cases where a memory cell MC connected to bit line BL is replaced by a redundancy memory cell MC connected to bit line BL' and where it is replaced by a redundancy memory cell MC connected to bit line BL'. This makes it more difficult to write logic level to the storage node SN of the redundancy memory cell MC.

A structure of a semiconductor memory device which addresses the first problem is disclosed in U.S. Pat. No. 5,666,315.

FIG. 17 is a schematic block diagram showing a main portion of the DRAM disclosed in the aforementioned U.S. Pat. No. 5,666,315.

In FIG. 17, same reference characters as in FIG. 12 denote the same components.

Different from the prior art shown in FIG. 12, power supply lines $V_{BL1}$, $V_{BL2}$, ..., $V_{BLs}$ for supplying precharge potential $V_{BL}$ for the bit lines and the line S2 of sense amplifier are arranged parallel to CS line for every unit of bit line pair group.

The precharge potential power supply lines and corresponding memory cell array portions are connected by nonvolatile switch means such as fuse elements, respectively.

Further, the line S2 is separated for each of the bit line pair group units 6100, 6102 and so on, which is a unit of replacement when there is a defective bit. An S2 line equalize circuit S2-EQ for connecting/disconnecting the pair of S2 lines is provided for each unit.

Now, when there is a short-circuit portion 6200 in a memory cell connected to bit line BL1 in bit line pair group unit 6100, for example, a fuse element 6028 is cut.

Accordingly, though there are first and second leak paths even after replacement by the unit of bit line pair group including the defective bit in the prior art example, the leak paths are cut off and leak current does not flow in accordance with the present structure.

Therefore, increase in standby current caused by the defective bit after replacement can be prevented.

FIG. 18 is a timing chart showing operation of a first embodiment.

Basically, the operation is similar to that of the conventional example shown in FIG. 13. Sensing operation is performed even for the bit line pair BL1, /BL1 connected to the defective bit, and the potential difference between the pair of bit lines is amplified.

Here, since there is leakage between bit line BL1 and the ground, bit line BL1 is amplified to the "L" level and bit line /BL1 to "H" level.

However, the bit line pair is replaced by a spare bit line pair, that is, SPARE BL1 and SPARE /BL1. Therefore, there is not a problem for the basic operation.

Thereafter, at time $t_9$, the signal BLEQ goes from low to high and paired bit lines BL1 and /BL1 are connected to each other and attain to the level of ½Vcc. However, because of leakage current, the voltage level of the bit line pair gradually lowers, and at time $t_{10}$, the potential is sufficiently lowered and thereafter a constant value is maintained.

Since fuse element 28 is cut, leakage current does not flow thereafter.

In the conventional redundancy circuit shown in FIG. 12, even when the bit line pair group unit including a defect is repaired, increase in standby current cannot be prevented.

By contrast, when S2 lines are isolated by the unit of replacement, the precharge power supply interconnection for the bit line and the line S2 is isolated and a leakage current path is cut by the fuse element as in the structure shown in FIG. 17, so that the first problem described above can be solved.

However, even by the DRAM having such a structure as shown in FIG. 17, the second problem cannot be solved. More specifically, since the defective memory cell MC which has been replaced by the redundancy memory cell MC cannot be accessed, a desired logic level cannot be written to the storage node SN of the replaced defective memory cell MC.

SUMMARY OF THE INVENTION

An object of the present invention is to provide a semiconductor memory device which allows writing of a desired logic potential level to a storage node of a replaced defective memory cell.

Another object of the present invention is to provide a semiconductor memory device which allows quick and easy writing of a logic potential level to a storage node of a memory cell.

In summary, the present invention provides a semiconductor memory device having a defective cell write mode, including a memory cell array, a redundancy memory cell array, a plurality of word lines, a plurality of bit line pairs, an internal potential generating circuit, a potential supply control circuit and a write circuit.

The memory cell array includes a plurality of memory cells arranged in a matrix of rows and columns. The redundancy memory cell array includes at least one column of memory cells for replacing a column of memory cells including a defective memory cell, among the columns of memory cells of the memory array. The plurality of word lines are provided corresponding to respective rows of memory cells, and provided common to the memory cell array and a redundancy memory cell array. The plurality of bit line pairs are provided corresponding to respective columns of memory cells. The internal potential generating circuit generates an equalize potential for the bit line pairs. The internal potential generating circuit outputs equalize potential at a first or a second logic level in accordance with designation of the defective cell write mode.

The potential supply control circuit sets the bit line pairs and the internal potential generating circuit to a conductive state or non-conductive state. The potential supply control circuit includes a first switch circuit which can set, in nonvolatile manner, a first connection path between a plurality of bit line pairs and the internal potential generating circuit to either connected or disconnected state on bit line pair by bit line pair basis, and a second switch circuit for maintaining a second connection path between the plurality of bit line pairs and the internal potential generating circuit conductive while the defective cell write mode is designated.

The write circuit selects a word line of the memory cell array in accordance with a row address signal, and writes first or second logic level supplied from the internal potential generating circuit through a bit line to a memory cell corresponding to the selected word line, in the period in which the defective cell write mode is designated.

Preferably, the write circuit writes the first or the second logic level supplied from the internal potential generating circuit through the bit line to a plurality of memory cells corresponding to the selected word line at one time.

Therefore, an advantage of the present invention is that, in a period in which the defective cell write mode is designated, a word line of the memory cell array is selected in accordance with the row address signal, and it is possible to write the first or second logic level supplied from the internal potential generating circuit through a bit line to a memory cell corresponding to the selected word line, no matter whether the memory cell belongs to the memory cell array or the redundancy memory cell array.

Another advantage is that as the first or second logic level supplied from the internal potential generating circuit through the bit line is written to a plurality of memory cells corresponding to the selected word line at one time, writing or the logic potential level to the storage nodes of memory cells can be carried out readily at high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
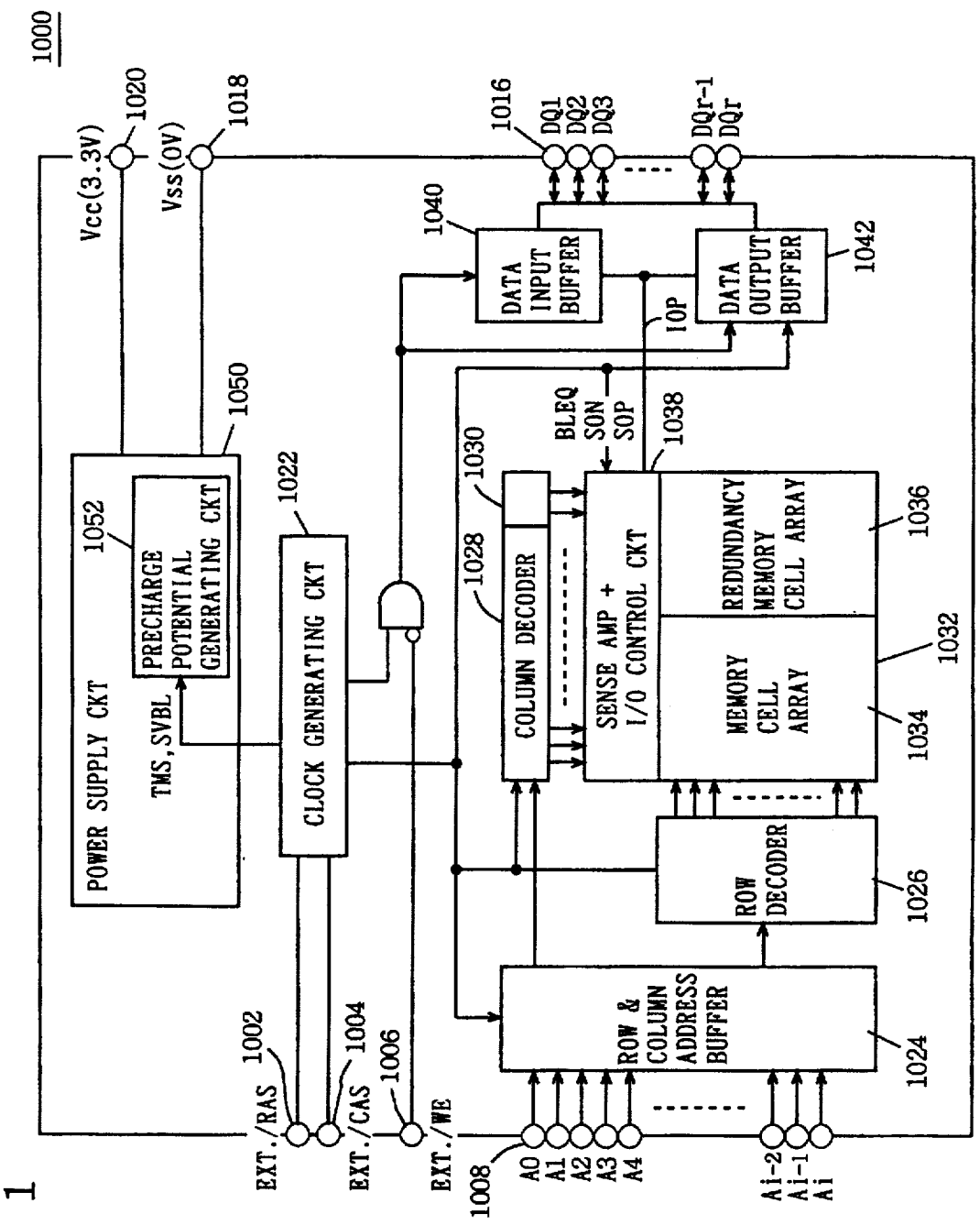
FIG. 1 is a schematic block diagram showing a structure of a DRAM 1000 in accordance with a first embodiment of the present invention.

FIG. 1 is a block diagram showing a structure of a dynamic random access memory (hereinafter referred to as a DRAM) 1000 in accordance with a first embodiment of the present invention.

Referring to FIG. 1, DRAM 1000 includes control signal input terminals 1002–1006, an address signal input terminal group 1008, a data signal input/output terminal group 1016, a ground terminal 1018, and a power supply terminal 1020.

Further DRAM 1000 includes a clock generating circuit 1022, a row and column address buffer 1024, a row decoder 1026, a column decoder 1028, a redundancy column decoder 1030, a memory mat 1032, a data input buffer 1040 and a data output buffer 1042. Memory mat 1032 includes a memory cell array 1034, a redundancy memory cell array 1036 and a sense amplifier+input/output control circuit 1038.

Clock generating circuit 1022 selects a prescribed operation mode based on signals EXT./RAS and EXT./CAS externally applied through control signal input terminals 1002 and 1004, and controls DRAM as a whole.

Row and column address buffer 1024 generates row address signals RA0–RAi and column address signals CA0–CAi based on address signals A0–Ai (where i is a natural number) applied externally through address signal input terminal group 1008, and applies the generated signals RA0–RAi and CA0–CAi to row decoder 1026 and column decoder 1028, respectively.

Memory mat 1032 includes a plurality of memory cells each storing data of 1 bit. Each memory cell is arranged at a prescribed address determined by the row and column addresses.

Row decoder 1026 designates a row address of memory cell array 1034 in response to row address signals RA0–RAi applied from row and column address buffer 1024. Column decoder 1028 designates a column address of memory cell array 1034 in response to column address signals CA0–CAi applied from row and column address buffer 1024.

In column decoder 1028 and redundancy column decoder 1030, a fuse group (not shown) is provided for programming a column address including the defective memory cell of memory cell array 1034 and the column address of redundancy memory cell array 1036 to be substituted for. When column address signals CA0–CAi corresponding to the defective column address programmed by the fuse group are input, column decoder 1028 does not designate that column address, while redundancy column decoder 1030 designates column address of redundancy memory cell array 1036 programmed in place of the defective address. In other words, the defective memory cell column including a defective memory cell in memory cell array 1034 is replaced by a normal column of memory cells of redundancy memory cell array 1036.

Sense amplifier.input/output control circuit 1038 connects, to one end of data signal input/output line pair IOP, the memory cell at the address designated by row decoder 1026 and column decoder 1028 (or redundancy column decoder 1030). The other end of data signal input/output line pair IOP is connected to data input buffer 1040 and data output buffer 1042. Data input buffer 1040 applies data input from data signal input/output terminal group 1016 through data signal input/output line pair IOP to the selected memory cell in response to a signal EXT./WE applied externally through control signal input terminal 1006 in a write mode. Data output buffer 1042 outputs data read out from the selected memory cell to data input/output terminal group 1016 in a read mode.

Power supply circuit 1050 receives external power supply potential Vcc and ground potential Vss and supplies various internal power supply potentials required for the operation of DRAM 1000. Power supply circuit 1050 includes a precharge potential generating circuit 1052 for supplying the precharge potential $V_{BL}$ for the bit line pairs included in memory cell array 1034.

Figure 2:
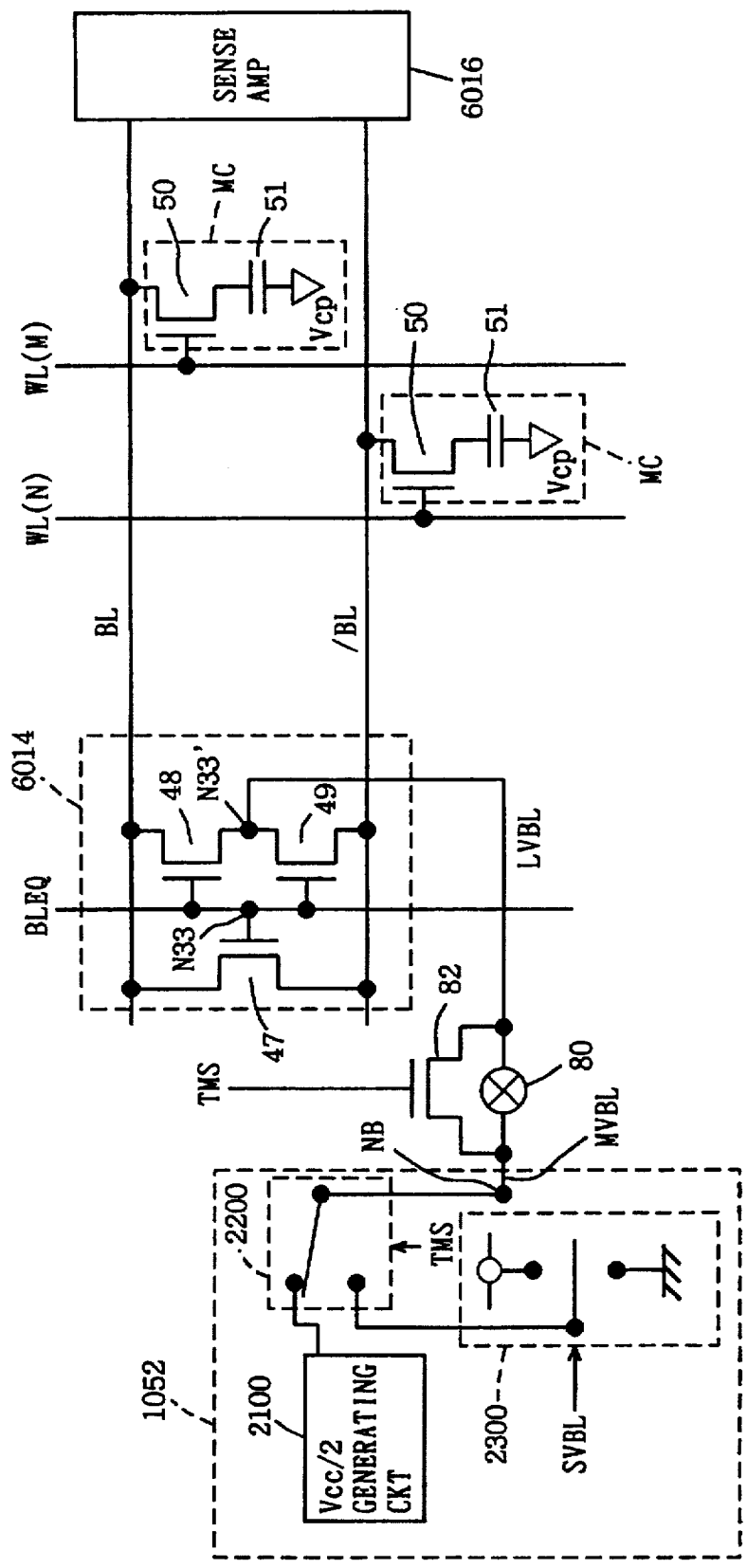
FIG. 2 is a partially omitted circuit block diagram showing in detail a structure of one column of memory cells.
Figure 15:
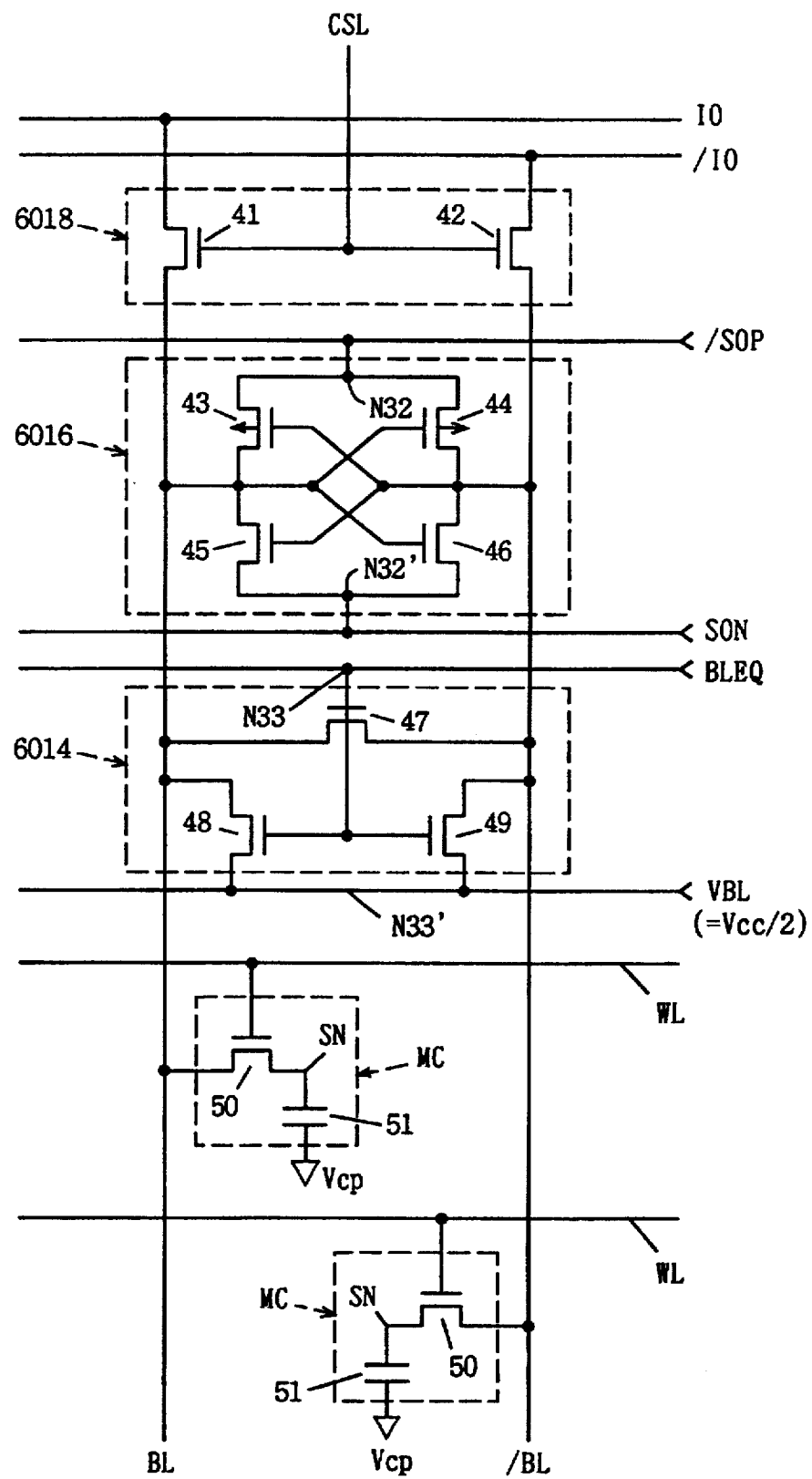
FIG. 15 is a partially omitted circuit block diagram showing, in detail, a structure of a column of memory cells of the first prior art DRAM.
Figure 16:
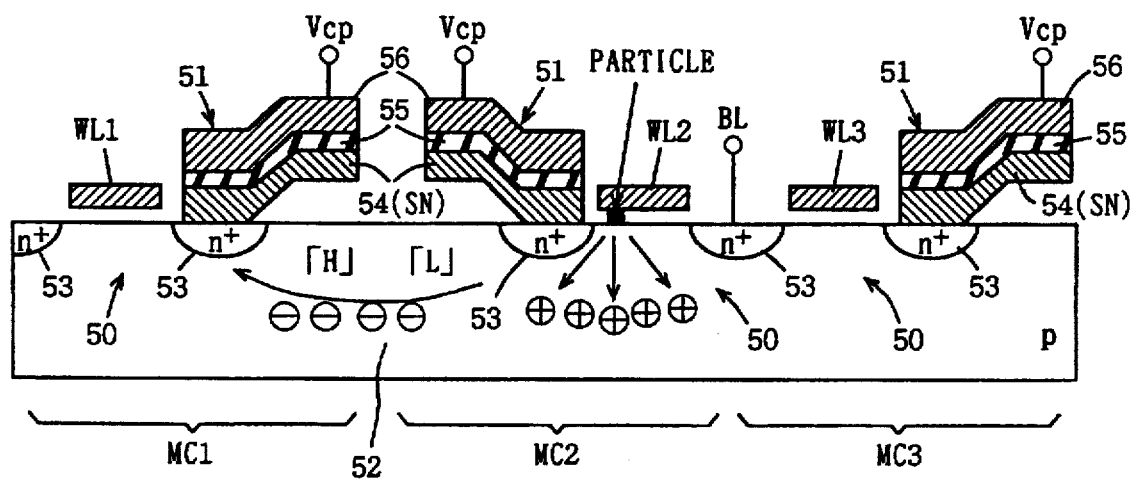
FIG. 16 is a cross section showing the structure of the first prior art DRAM.

FIG. 2 is a partially omitted circuit block diagram showing, in detail, a structure of a column of memory cells, of the DRAM 1000 shown in FIG. 1, and FIG. 2 corresponds to FIG. 15. In FIG. 2, components such as column selection gate 6018 for selectively connecting the bit line pair to the IO line pair is not shown.

Referring to FIG. 2, memory cell array 1034 or redundancy memory cell array 1036 includes a plurality of memory cells MC arranged in a matrix of rows and columns, word lines WL provided corresponding to respective rows and bit line pairs BL, /BL provided corresponding to respective columns.

Each memory cell MC is connected to the word line WL of the corresponding row. A plurality of memory cells MC of odd-numbered columns are connected alternately to bit line BL or /BL. A plurality of memory cells MC of even-numbered columns are connected alternately to bit line /BL or BL.

Each memory cell MC has the same structure as the prior art shown in FIG. 15. Therefore, corresponding portions are denoted by same reference characters and description thereof is not repeated.

A sense amplifier 6016 and an equalizer 6014 are provided for each column, and a precharge potential generating circuit 1052 is provided common to all the columns.

Sense amplifier 6016 includes P channel MOS transistors 43 and 44 connected between node N32 and bit lines BL, /BL, respectively, and N channel MOS transistors 45 and 46 connected between node N32' and bit lines BL, /BL, respectively. MOS transistors 43 and 45 have their gates connected together to bit line /BL, and MOS transistors 44 and 46 have their gates connected together to bit line BL. Nodes N32 and N32' receive sense amplifier activating signals SON and /SOP output from clock generating circuit 1022, respectively.

In a normal read operation, sense amplifier 6016 amplifies a small potential difference between the pair of bit lines BL and /BL to power supply voltage Vcc in response to sense amplifier activating signals SON and /SOP attained to the "H" and "L" levels, respectively.

As will be described later, in the period in which the defective cell write mode is designated, sense amplifier 6016 is kept inactive.

Equalizer 6014 includes an N channel MOS transistor 47 connected between bit lines BL and /BL, and N channel MOS transistors 48 and 49 connected between node N33' and bit lines BL and /BL, respectively. N channel MOS transistors 47 to 49 have their gates connected to node N33. Node N33 receives bit line equalize signal BLEQ, and node N33' is connected to a sub bit line potential supplying interconnection LVB1.

Equalizer 6014 equalizes the potentials of bit lines BL and /BL to the precharge potential VBL supplied from sub bit lint potential supplying interconnection LVBL in response to bit line equalize signal BLEQ attaining to the active level of "H".

Sub bit line potential supplying interconnection LVBL is connected to a main bit line potential supplying interconnection MVBL through a fuse element 80 and a pass transistor 82 connected parallel to each other. Pass transistor 82 is controlled by a signal TMS designating defective cell write mode, which is activated in response to designation of the defective cell write mode, and the transistor is rendered and kept conductive in the defective cell write mode.

Precharge potential generating circuit 1052 includes an output node ND, a Vcc/2 generating circuit 2100 for generating an intermediate potential VCC/2 between an internal power supply potential VccA and a ground potential Vss, a switch circuit 2200 receiving an output from Vcc/2 generating circuit 2100 for transmitting or cutting intermediate potential Vcc/2 to output node NB under the control of the signal TMS designating defective cell write mode, and a write potential generating circuit 2300 for outputting either the potential at the high level (internal power supply potential VccA) or low level (ground potential Vss) in accordance with a special write level designating signal SVBL.

The potential output from node NB of precharge potential generating circuit 1052 is transmitted through main bit line potential supplying interconnection MVBL.

Figure 3:
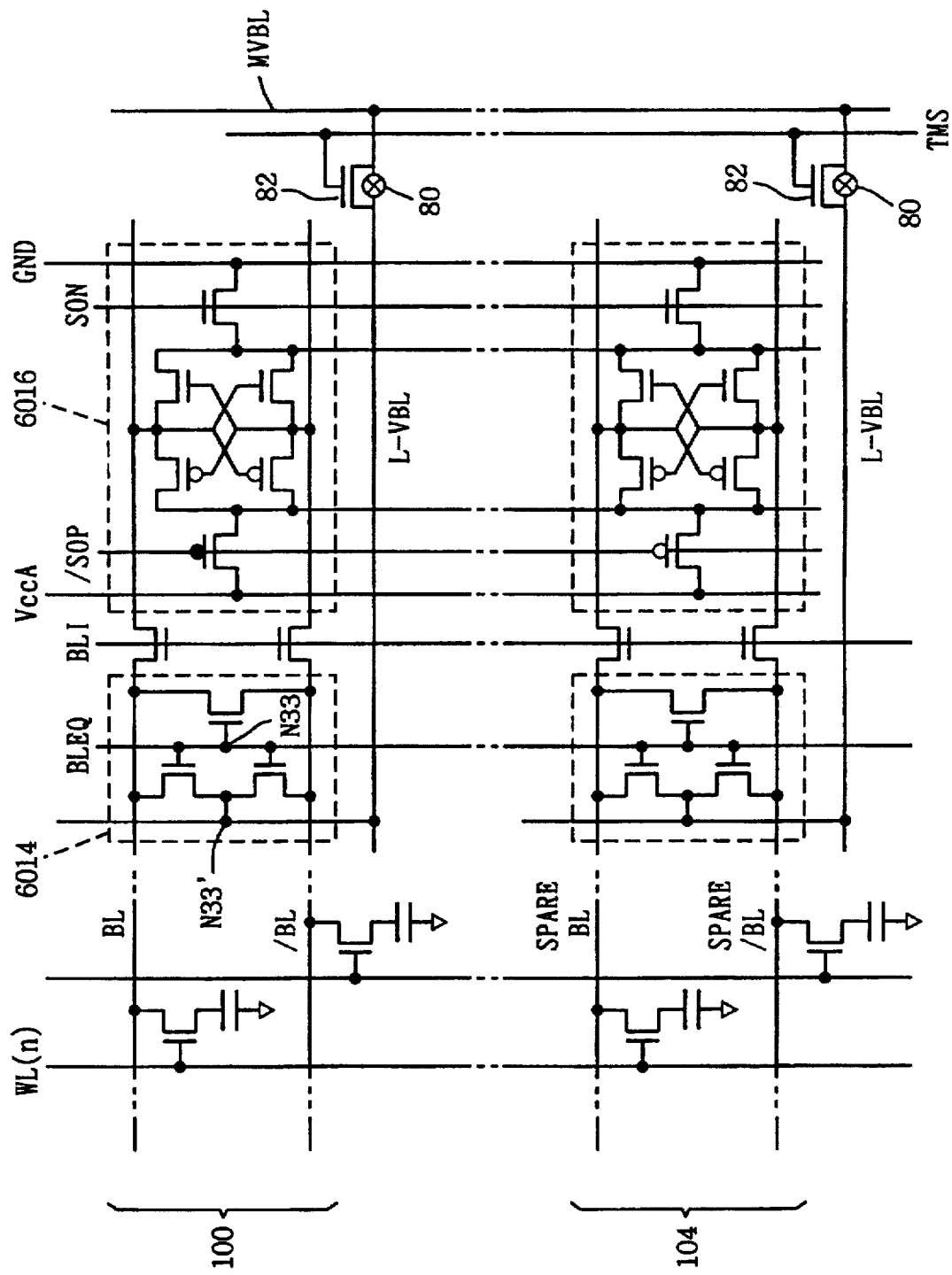
FIG. 3 is a circuit diagram of a main portion, extracting a portion of a memory mat 1032.

FIG. 3 is a circuit diagram showing a main portion extracted from memory mat 1032, when a structure similar to the column of memory cells shown in FIG. 2 is included both in memory cell array 1034 and redundancy memory cell array 1036.

Both sub bit potential supplying interconnection LVBL supplying the precharge potential to the bit line pair BL, /BL included in memory cell array 1034 and sub bit line potential supplying interconnection LVBL for supplying the precharge potential to the spare bit line pair spare BL, spare /BL included in redundancy memory cell array 1036 are connected to main bit line potential supplying interconnection MVBL through fuse element 80.

Pass transistor 82 controlled by the signal TMS is provided parallel to each fuse element 80.

Therefore, when there is a memory cell connected to the bit line pair BL, /BL and the bit line pair BL, /BL has been replaced by the spare bit line pair SPARE BL, SPARE /BL, then fuse element 80 corresponding to the bit line pair BL, /BL is cut, preventing generation of leakage current in the standby state.

When the defective cell write mode is designated and the signal TMS attains to the active state ("H" level), pass transistor 80 is rendered conductive, and in response to activation of signal BLEQ, the potential from precharge potential generating circuit 1052 is supplied both to the bit line pair BL, /BL and spare bit line pair SPARE BL, SPARE /BL, through main bit line potential supplying interconnection MVBL.

Figure 4:
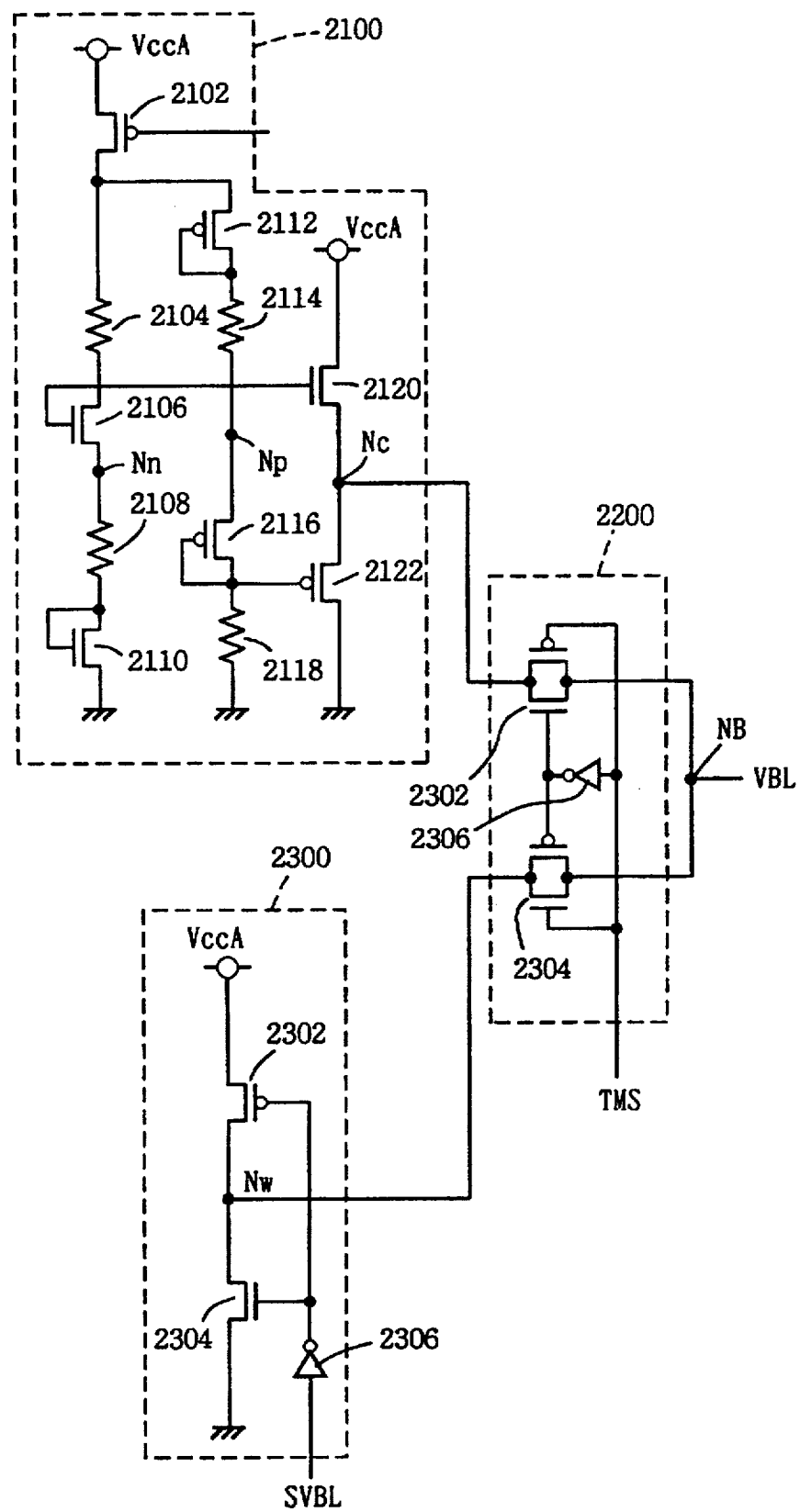
FIG. 4 is a circuit diagram showing a structure of a precharge potential generating circuit 1052.

FIG. 4 is a schematic diagram showing the structure of precharge potential generating circuit 1052 shown in FIG. 1.

Precharge potential generating circuit 1052 will be described in greater detail. Precharge potential generating circuit 1052 includes a Vcc/2 generating circuit 2100 for generating three precharge potentials in response to activation/inactivation of signal TMS for generating intermediate potential Vcc/2 ; a write potential generating circuit 2300 for outputting either the potential at the high level (internal power supply potential VccA) or a potential at low level (ground potential Vss) to output node NB in response to special write level designating signal SVBL; and a switch circuit 2200 receiving an output from Vcc/2 generating circuit 2100 and an output from write potential generating circuit 2300 for selectively outputting the output from Vcc/2 generating circuit 2100 while the signal TMS for designating defective cell write mode is inactive, and the output from write potential generating circuit 2300 while the signal TMS for designating defective cell write mode is active, to output node NB.

In the following, the internal power supply potential generated by power supply circuit 1050 from external power supply potential Vcc will be referred to as potential Vcca.

Vcc/2 generating circuit 2100 includes a P channel MOS transistor 2102 receiving at its source internal power supply potential VccA and is rendered conductive in response to inactivation of signal TMS, a resistor 2104 and an N channel MOS transistor 2106 connected in series between the drain of P channel MOS transistor 2102 and a node Nn, and a resistor 2108 and an N channel MOS transistor 2110 connected in series between node Nn and the ground potential.

N channel MOS transistors 2106 and 2110 are each diode connected such that the direction from internal power supply potential VccA to the ground potential matches the forward direction.

Vcc/2 generating circuit 2100 further includes a P channel MOS transistor 2112 and a resistor 2114 connected in series between the drain of P channel MOS transistor 2102 and a node Np, and a P channel MOS transistor 2116 and a resistor 2118 connected in series between node Np and a ground potential.

P channel MOS transistors 2112 and 2116 are each diode connected such that the direction from internal power supply potential VccA to the ground potential matches the forward direction.

Vcc/2 generating circuit 2100 further includes an N channel MOS transistor 2120 and a P channel MOS transistor 2122 connected in series between internal power supply potential VccA and a ground potential, with a node Nc positioned therebetween.

N channel MOS transistor 2120 receives at its gate the gate potential of N channel MOS transistor 2106, while P channel MOS transistor 2122 receives at its gate the gate potential of P channel MOS transistor 2116.

It is assumed that resistors 2104 and 2110 have the same resistance value, and resistors 2114 and 2118 have the same resistance value.

Further, it is assumed that N channel MOS transistors 2106, 2110 and 2120 have the same characteristics, and P channel MOS transistors 2112, 2116 and 2122 have the same characteristics.

Accordingly, the potential level at node Mn is one half (½) the internal power supply potential VccA. In other words, the gate potential of N channel MOS transistor 2106 is biased such that its source attains to the potential level of node Nn.

Similarly, the potential at node Np is one half (½) the internal power supply potential VccA. In other words, the gate potential of P channel MOS transistor 2116 is biased so that its source attains to the potential level of node Np.

More specifically, the gate of N channel MOS transistor 2120 and the gate of P channel MOS transistor 2122 are biased such that the potential level of node Nc which is the point of connection therebetween is one half the internal power supply potential VccA. Therefore, the potential level of node Nc is controlled to one half the internal power supply potential VccA.

Write potential generating circuit 2300 includes a P channel MOS transistor 2302 and an N channel MOS transistor 2304 connected in series between internal power supply potential VccA and a ground potential with a node Nw positioned therebetween, and an inverter 2306 receiving the signal SVBL and having an output node connected to the gates of P channel MOS transistor 2302 and N channel MOS transistor 2304.

Further, switch circuit 2200 includes a transmission gate 2302 which renders conductive connection between nodes Nc and NB in response to inactivation (transition to the low level) of the signal TMS, a transmission gate 2304 for rendering conductive connection between nodes Nw and NB in response to activation (transition to high level) of the signal TMS, and an inverter 2306 receiving the signal TMS and applying an inverted signal to transmission gate 2303 and 2304.

Figure 5:
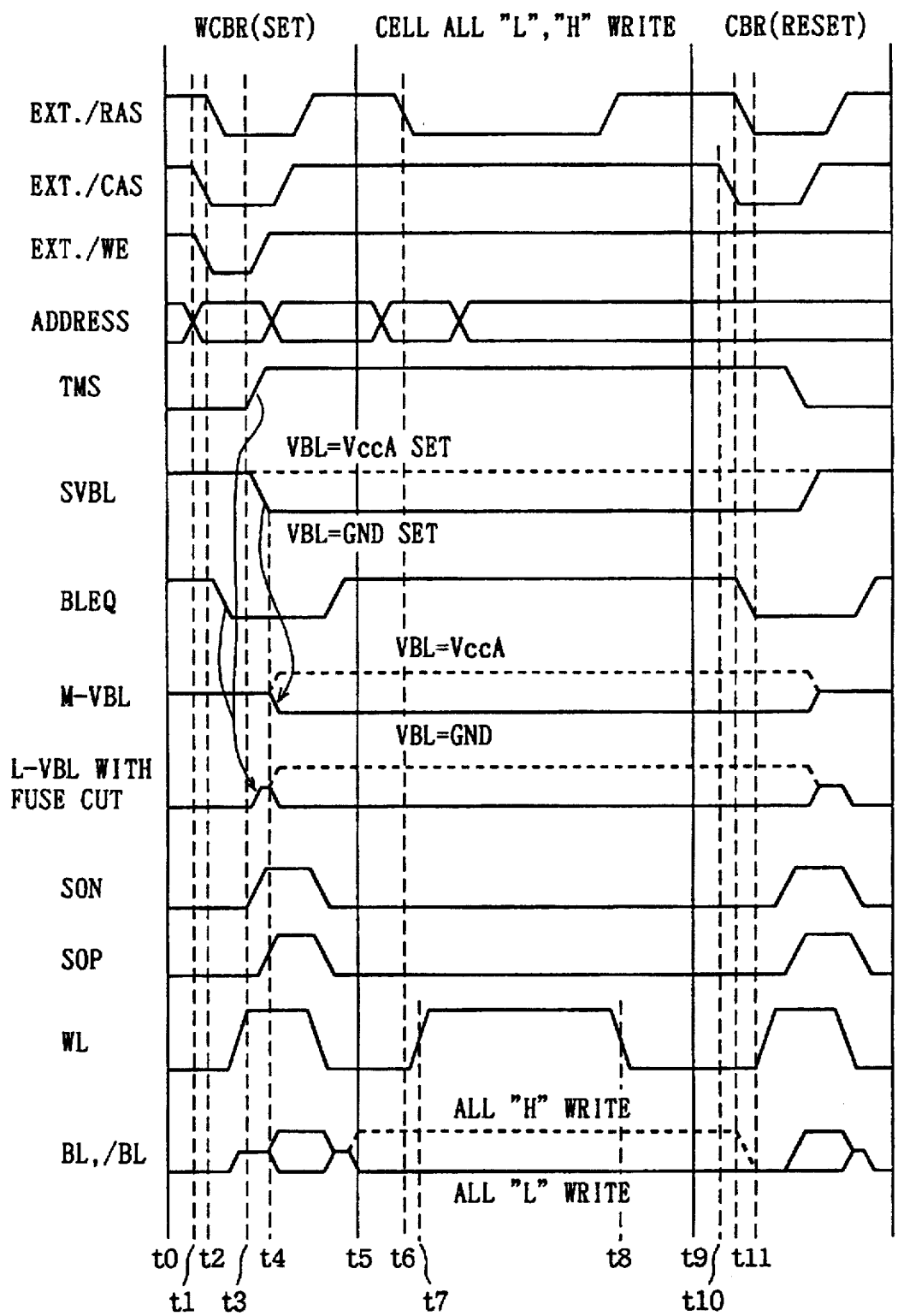
FIG. 5 is a timing chart illustrating operation of DRAM 1000.

FIG. 5 is a timing chart illustrating the operation of DRAM 1000 shown in FIG. 1.

Referring to FIG. 5, at time t1, external column address strobe signal EXT./CAS and external write enable signal EXT./WE are activated (transition to low level), and thereafter, at time t2, external row address strobe signal EXT./RAS is activated (transition to low level). Therefore, a so-called WCBR condition is designated, thereby setting the defective cell write mode.

In response, test mode designating signal TMS is activated (transition to high level) at time t3.

In accordance with an address signal value at time t2 when WCBR condition is designated, the level of data to be written in the defective cell write mode is designated, as will be described later. In the example shown in FIG. 5, writing of "L" level is designated, and the signal SVBL attains to the "L" level at time t4, as represented by the solid line.

In response to activation of a bit line equalize signal at time t2, the potential of main bit line potential supplying interconnection MVBL which has been at the potential level of Vcc/2 attains to the "L" level output from precharge potential generating circuit 1052 in response to the signal SVBL at time t4.

The potential level of sub bit line potential supplying interconnection LVBL for which fuse is cut, attains to the "L" level at time t4, since pass transistor 82 is rendered conductive in response to activation of the signal TMS.

At time t6 after designation of the defective cell write mode, external row address strobe signal EXT./RAS is activated (transition to the low level), and a row address is taken.

At time t7, the potential level of word line WL selected in accordance with the aforementioned row address is activated. Accordingly, data at the "L" level is written to every memory cell connected to the activated word line.

At time t8, the potential level of the selected word line is inactivated. From time t5 to t9, that is, in the period of the defective cell write mode, the sense amplifier is not activated.

Thereafter, at time t10, while external write enable signal EXT./WE is maintained inactive, external column address strobe signal EXT./CAS is activated (transition to low level), and thereafter, at time t11, external row address strobe signal EXT./RAS is activated (transition to the low level).

Accordingly, the so-called CBR condition is designated, and the defective cell write mode is terminated (reset).

Figure 6:
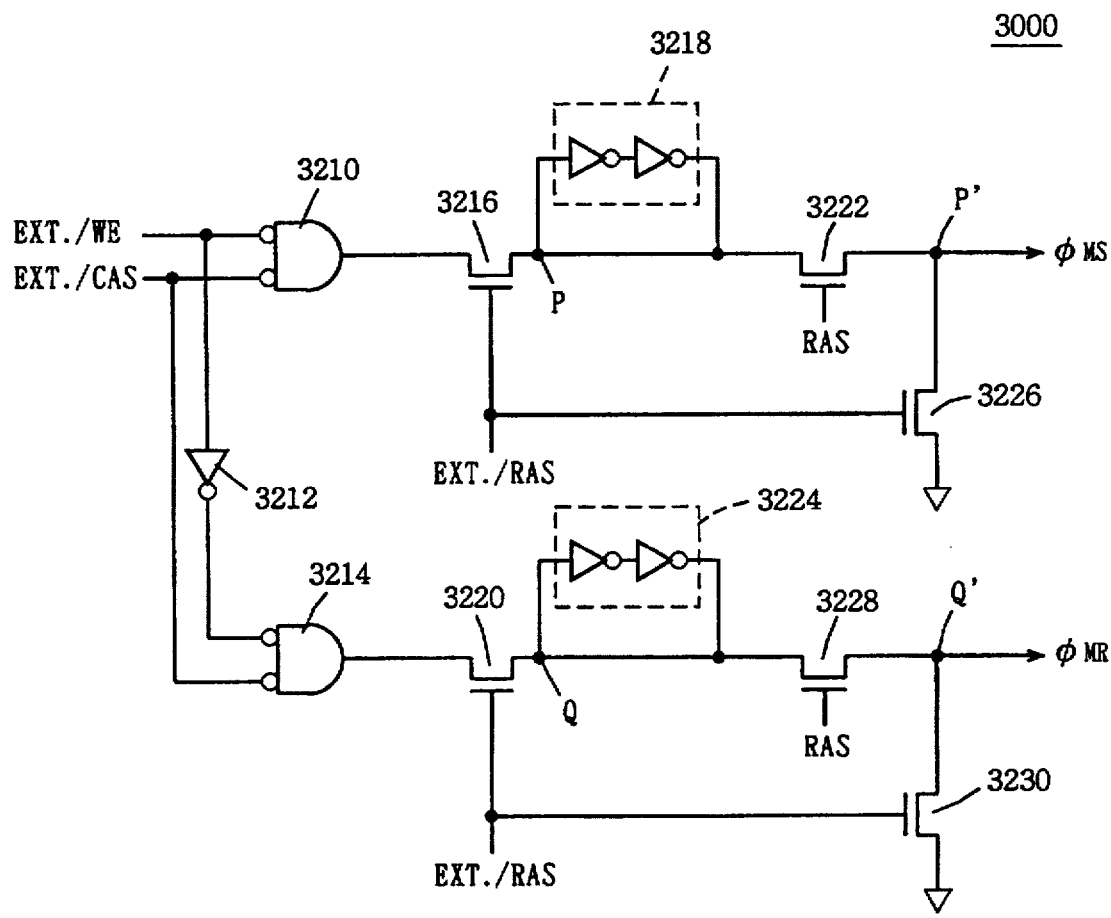
FIG. 6 is a circuit diagram showing a structure of a first internal circuitry of a mode setting circuit.
Figure 7:
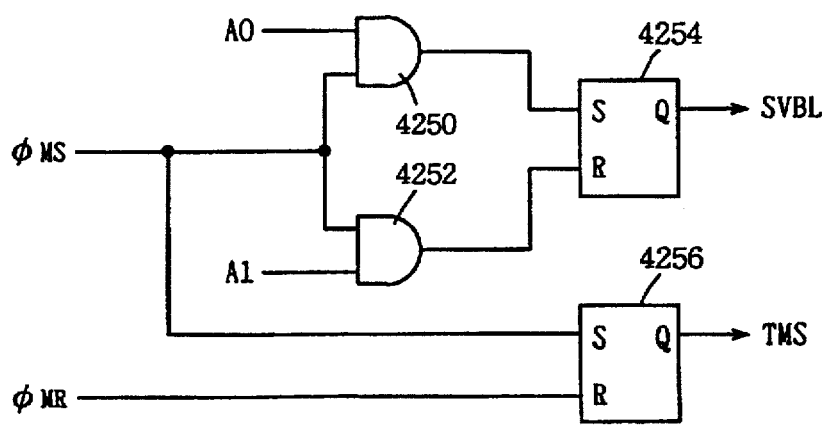
FIG. 7 is a circuit diagram showing a structure of a second internal circuitry of a mode setting circuit.

FIGS. 6 and 7 are circuit diagrams showing the structure of the mode setting circuit included in clock generating circuit 1022 shown in FIG. 1, for activating the signal TMS and setting the signal SVBL to the "H" or "L" level in accordance with external control signals EXT./RAS, EXT./CAS and EXT./WE as well as address signals A0 and A1.

The signal EXT./WE is a write enable signal designating data writing. The signal EXT./CAS is a column address strobe signal which activates a circuit for selecting a column in memory cell plane 1032. Address signals A0 and A1 represent the least significant and second least significant bits of externally applied address signal bits.

The mode setting circuit includes a first internal circuitry 3000 for activating internal control signals $\phi_{MS}$ and $\phi_{MR}$ in response to signals EXT./WE, EXT./RAS and EXT./CAS, and a second internal circuitry 4000 for activating the defective cell write mode designating signal TMS in response to signals $\phi_{MS}$ and $\phi_{MR}$ and for setting the level of the signal SVBL in response to signals $\phi_{MS}$ and $\phi_{MR}$ as well as signals A0 and A1.

First internal circuitry 3000 includes an NOR circuit 3210 receiving signals EXT./WE and EXT./CAS, an N channel MOS transistor 3216 having one of its source and drain connected to an output of NOR circuit 3210, a latch circuit 3218 for holding potential level of a node P corresponding to the other one of the source and drain of N channel MOS transistor 3216, an N channel MOS transistor 3222 receiving at its gate the signal RAS and having one of source and drain connected to node P and the other outputting internal control signal $\phi_{MS}$, and an N channel MOS transistor 3226 connected between a node P' and a ground potential, and receiving at its gate the signal EXT./RAS.

First internal circuitry 3000 further includes an inverter 3212 receiving the signal EXT./WE, an NOR circuit 3214 receiving the signal EXT./CAS and an output from inverter 3212, an N channel MOS transistor 3220 receiving at its gate the signal EXT./RAS, one of source and drain connected to an output of NOR circuit 3214 and the other connected to a node Q, a latch circuit 3224 for holding potential level of node Q, an N channel MOS transistor 3228 receiving at its gate a signal RAS (inverted signal of EXT./RAS), having one of source and drain connected to node Q and the other connected to a node Q' outputting the signal $\phi_{MR}$, and an N channel MOS transistor 3230 receiving at its gate the signal EXT./RAS and connected between node Q' and the ground potential.

Referring to FIG. 7, second internal circuitry 4000 includes an AND circuit 4250 receiving address signal A0 and signal $\phi_{MS}$, an AND circuit 4252 receiving address signal A1 and signal $\phi_{MS}$, an SR flip-flop circuit 4254 receiving as a set signal an output from AND circuit 4250, as a reset signal an output from AND circuit 4252, and outputting the signal SVBL, and an SR flip-flop circuit 4256 receiving as a set signal the signal $\phi_{MS}$, as a reset signal the signal $\phi_{MR}$ and outputting the signal TMS.

The operation of the mode select circuit will be described briefly in the following.

Figure 8:
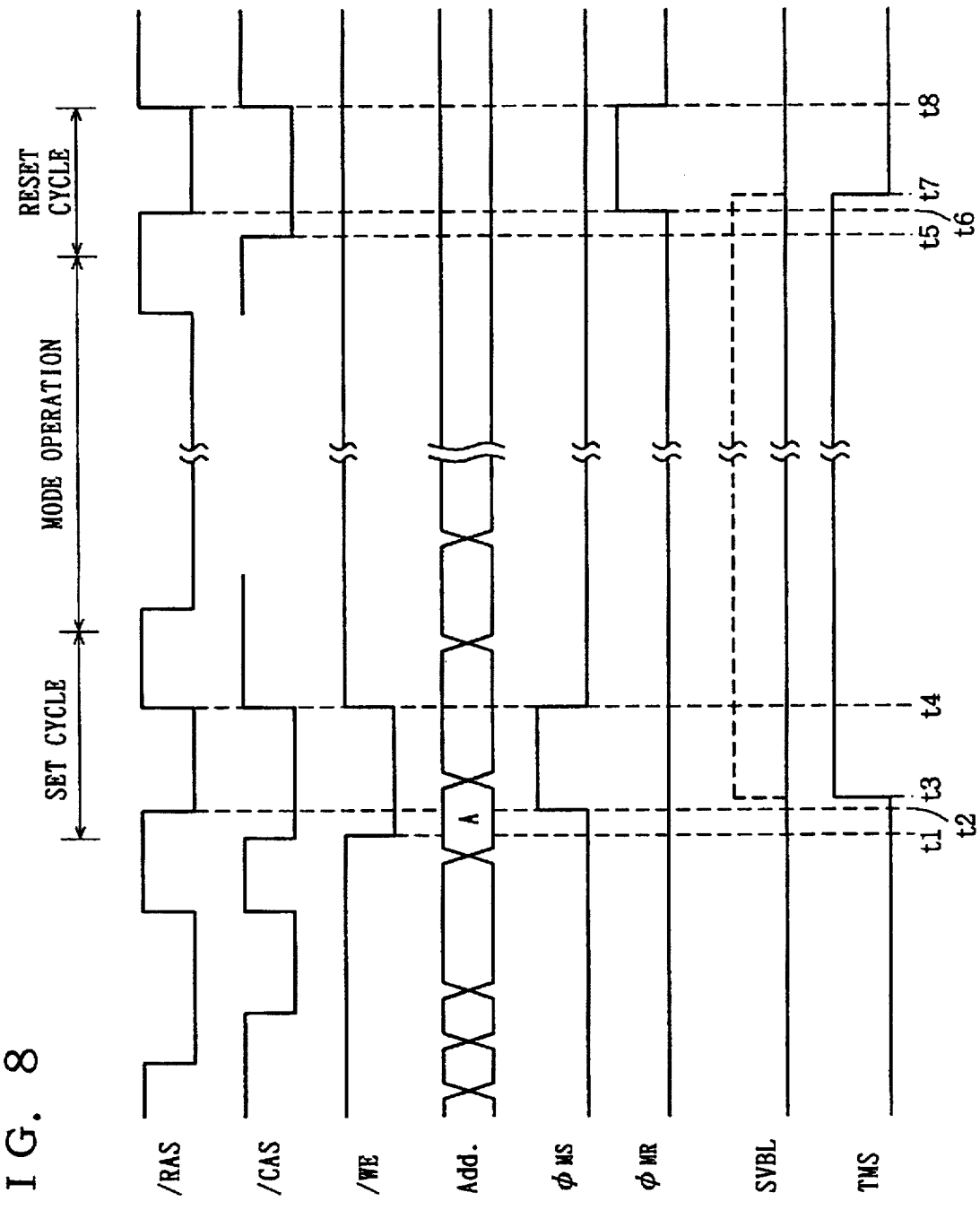
FIG. 8 is a timing chart illustrating the operation of the mode setting circuit.

FIG. 8 is a timing chart showing the operation of the mode select circuit.

At time t1, signals EXT./CAS and EXT./WE fall from high to low. Thereafter, at time t3, the signal EXT./RAS also falls to the low level. In other words, the so-called WCBR condition is set, and in accordance with an address signal value at the time point when the signal EXT./RAS falls, the level of the signal SVBL is set to "H" or "L" level.

In the following description, it is assumed that signal A1 is at the "H level at time t3. In the period from time t1 to t3, as signals EXT./WE and EXT./CAS are both at the low level, the output level of NOR circuit 3210 is high. In the period from t1 to t2, the signal EXT./RAS is at the high level, and N channel MOS transistor 3216 is conductive. Therefore, the potential level of node P is also high. The potential level is held by latch circuit 3218.

Meanwhile, the potential level of node Q connected to the output node of NOR circuit 3214 is low, which potential level is held by latch circuit 3224.

From t1 to t2, N channel MOS transistors 3222 an 3228 receiving at their gates the signal RAS (inverted signal of EXT./RAS) are both non-conductive, while N channel MOS transistors 3226 and 3230 receiving at their gates the signal EXT./RAS are both conductive. Therefore, potential levels of nodes P' and Q' are both low, and signals $\phi_{MS}$ and $\phi_{MR}$ are both at the low level.

When the signal EXT./RAS falls from high to low at time t2, N channel MOS transistors 3216, 3220, 3226 and 3230 are all rendered nonconductive. By contrast, N channel MOS transistors 3222 and 3228 receiving at their gates the signal RAS are both rendered conductive. Accordingly, at time t3, the potential level of node P' rises to the high level while the potential level of node Q' is kept low.

More specifically, as shown in FIG. 8, at time t2, the signal $\phi_{MS}$ changes to the high level.

In response, the output from SR flip-flop circuit 4256, that is, the level of the signal TMS is set to the high level.

Then, referring to FIG. 7, since address signal bit A1 is at the high level at time t2, the input signal $\phi_{MS}$ and the signal A1 which are the input signals to AND circuit 4252 both attain to the high level, and the output level of AND circuit 4252 changes to the high level. Therefore, the output level of SR flip-flop circuit 4254 is reset to the low level.

Meanwhile, since address signal bit A0 is low, the output level of AND circuit 4250 is kept low.

By the above described operation, the signal SVBL is set to the low level.

At time t4, the signal EXT./RAS attains to the high level and, in response, N channel MOS transistors 3226 and 3230 are both rendered conductive and potential levels of nodes P' and Q', that is, levels of signals $\phi_{MS}$ and $\phi_{MR}$ both attain to the low level.

By the above described operation, the defective cell write mode set cycle is completed.

The operation of a reset cycle for resetting the defective cell write mode will be described.

In the reset cycle, at time t5, the signal EXT./CAS falls to the low level and thereafter, at time t6, the signal EXT./RAS falls to the low level. Namely, the so-called CBR condition is set.

From t5 to t6, the potential level at the output node of NOR circuit 3214 is at the high level, while the output node of NOR circuit 3210 is kept at the low level.

Similar to the set cycle, in accordance with the potential levels of output nodes of NOR circuits 3210 and 3214 in this period (t5 to t6), the signals $\phi_{MS}$ and $\phi_{MR}$ are output at the falling edge of signal EXT./RAS at time t6.

More specifically, at time t6, the signal $\phi_{MS}$ is kept at the low level, and the signal $\phi_{MR}$ rises to the high level. In response, the output level of SR flip-flop circuit 4256 is reset, and at time t7, the signal TMS attains to the low level.

At time t8, signals EXT./RAS and EXT./CAS both return to the high level, and in response, the signal $\phi_{MR}$ also returns to the low level.

In the foregoing, the operation of the mode select circuit when the write data is at the low level, that is, when the signal SVBL attains to the low level, has been described.

Assuming that address signal bit A0 is at the high level and a signal A1 is at the low level at the time point t2, the mode select circuit performs the operation when the write data is at the high level, that is, when the signal SVBL attains to the high level, in the similar manner.

In DRAM 1000 in accordance with the first embodiment having the above described structure, in the period when the defective cell write mode is designated, it is possible to select a word line of a memory cell array in accordance with a row address signal and to simultaneously write to memory cells connected to the word line, the data of the low level or high level supplied through a bit line from precharge potential generating circuit 1052, no matter whether the column of memory cells belongs to the memory cell array or the redundancy memory cell array.

First Modification of the First Embodiment

Figure 9:
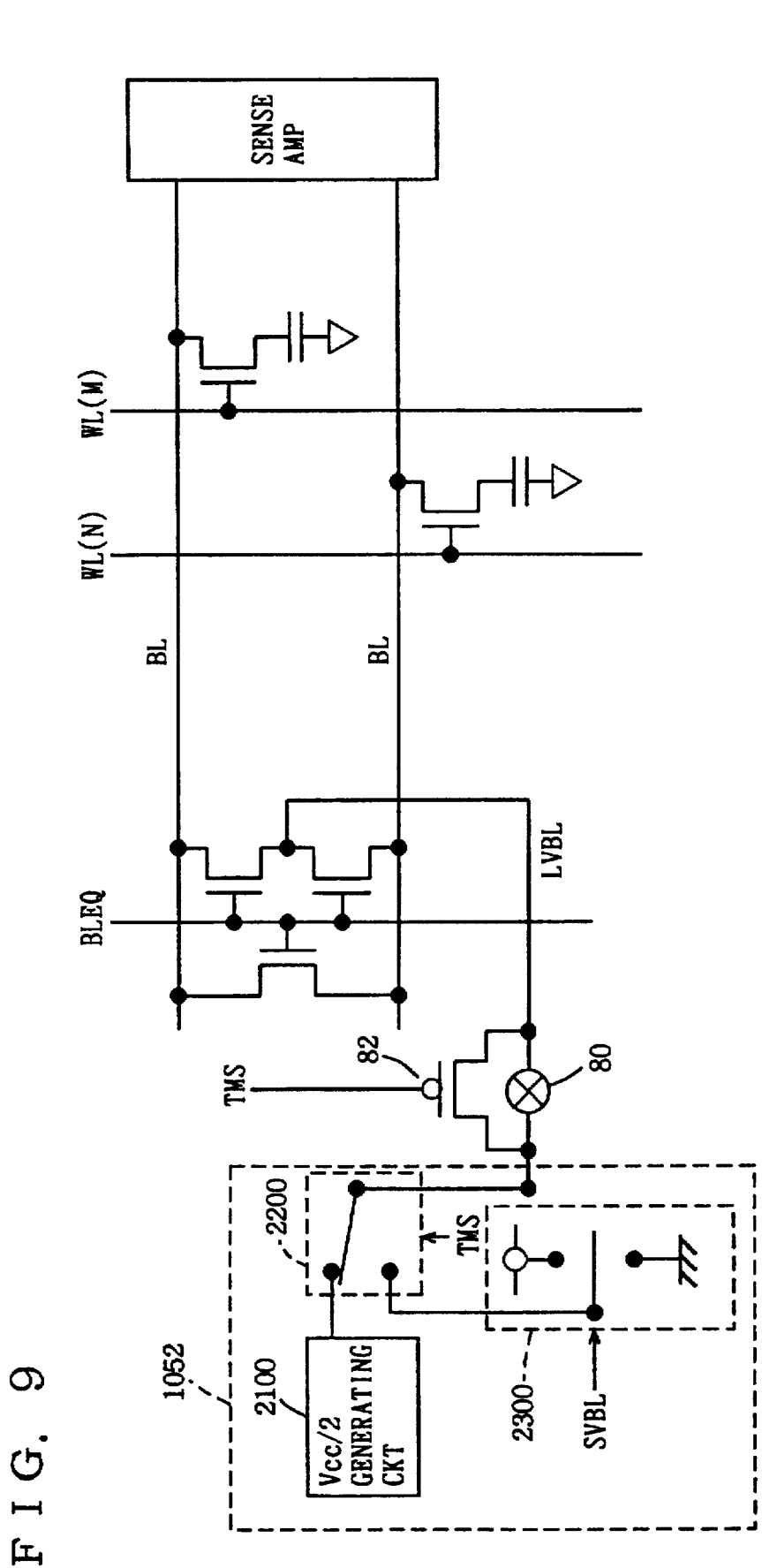
FIG. 9 is a partially omitted circuit block diagram showing in detail the structure of another modification of one column of memory cells.

FIG. 9 is a partially omitted circuit block diagram showing another structure of one column of memory cells in detail, of the DRAM 1000 shown in FIG. 1, which corresponds to FIG. 2.

The structure is different from that of FIG. 2 in that pass transistor 82 is not an N channel MOS transistor but a P channel MOS transistor.

Except this point, the structure is the same as that of FIG. 2. Therefore, corresponding portions are denoted by the same reference characters and description thereof is not repeated.

As compared with the structure shown in FIG. 2, when the data at the high level supplied through a bit line from precharge potential generating circuit 1052 is written simultaneously to memory cells connected to the selected word line, it is possible to prevent lowering of the potential level of write data by the threshold voltage of the pass transistor.

Second Modification of the First Embodiment

Figure 10:
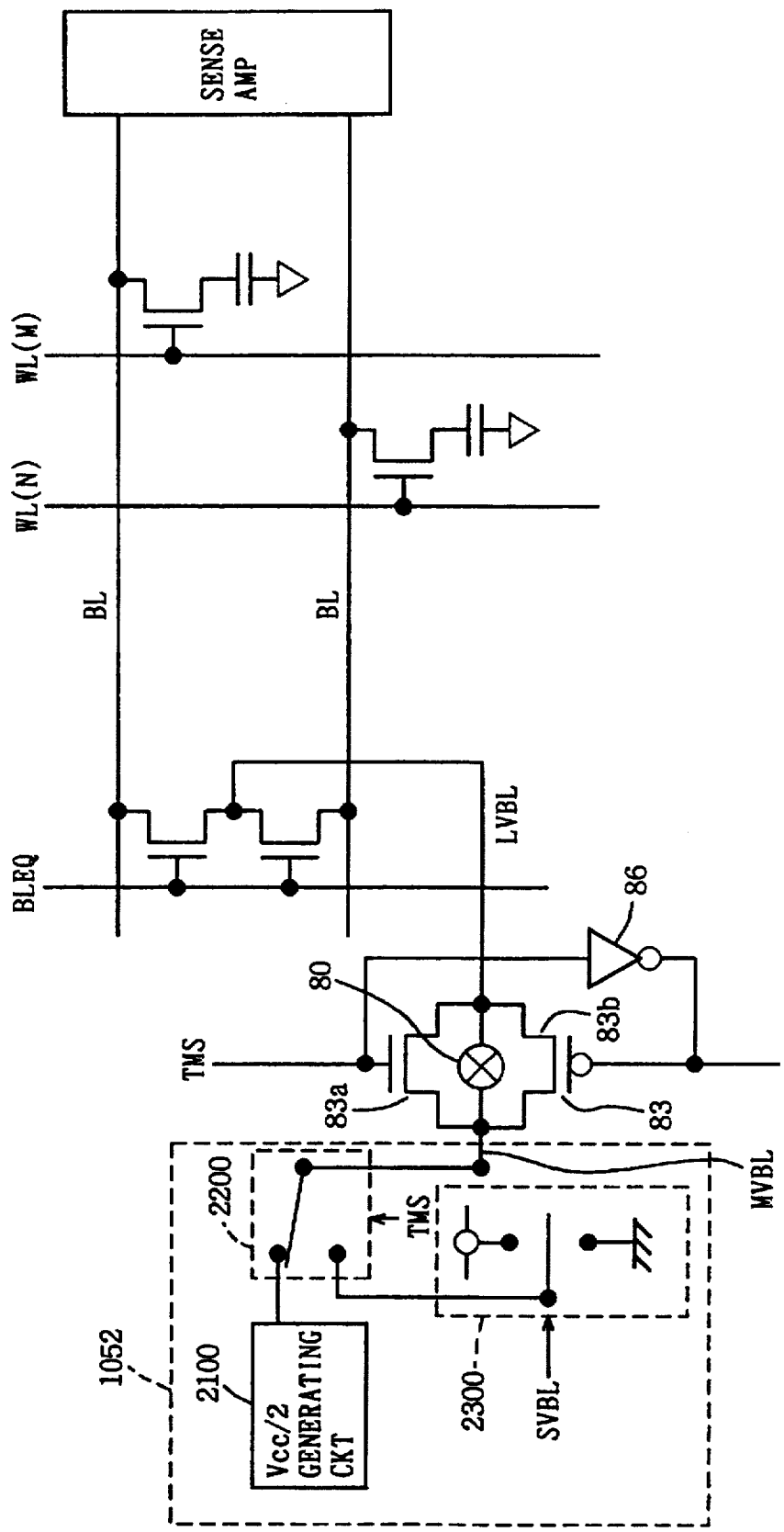
FIG. 10 is a partially omitted circuit block diagram showing in detail a structure of a still further modification of one column of memory cells.

FIG. 10 is a partially omitted circuit block diagram showing another structure of a column of memory cells in detail, of DRAM 1000 shown in FIG. 1, which corresponds to FIG. 2.

The structure is different from that shown in FIG. 2 in that pass transistor 82 formed of N channel MOS transistor is replaced by a transmission gate controlled by a signal TMS and a signal obtained by inverting the signal TMS by an inverter 86.

Transmission gate 83 includes an N channel MOS transistor 83a and a P channel MOS transistor 83b connected in parallel between main bit line potential supplying interconnection MVBL and sub bit line potential supplying interconnection LVBL and receiving at their gates the signal TMS and the output of inverter 86, respectively.

Except this point, the structure is the same as that shown in FIG. 2. Therefore, corresponding portions are denoted by the same reference characters and description thereof is not repeated.

Therefore, as compared with the structure shown in FIG. 2, when the data of high level or low level supplied through a bit line from precharge potential generating circuit 1052 is simultaneously written to memory cells connected to the selected word line, it is possible to prevent lowering of the potential level of the write data at the high level or increase in the potential level of the write data of the low level, by the threshold voltage of the pass transistor.

Second Embodiment

Figure 11:
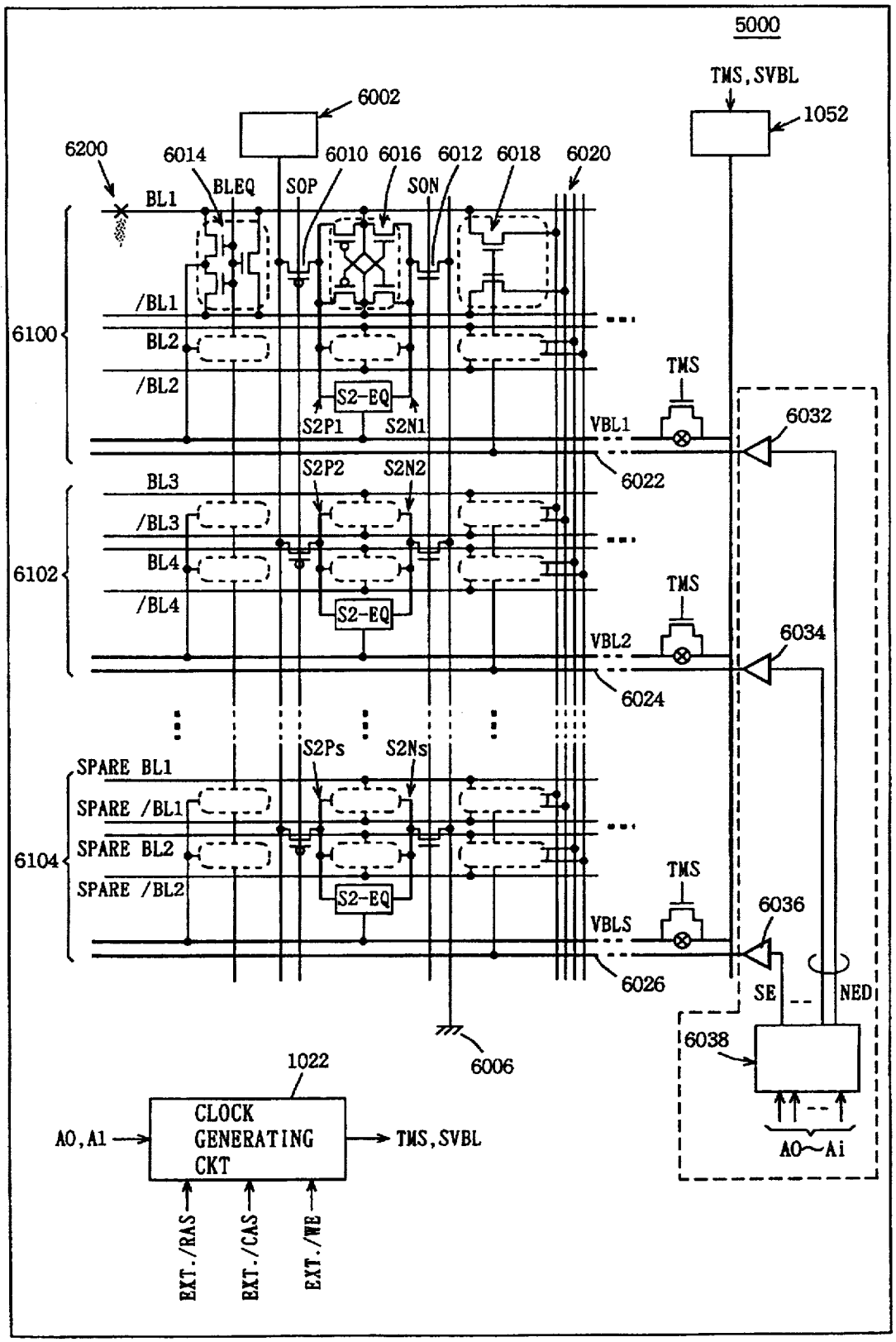
FIG. 11 is a schematic block diagram showing a structure of a DRAM 5000 in accordance with a second embodiment of the present invention.
Figure 12:
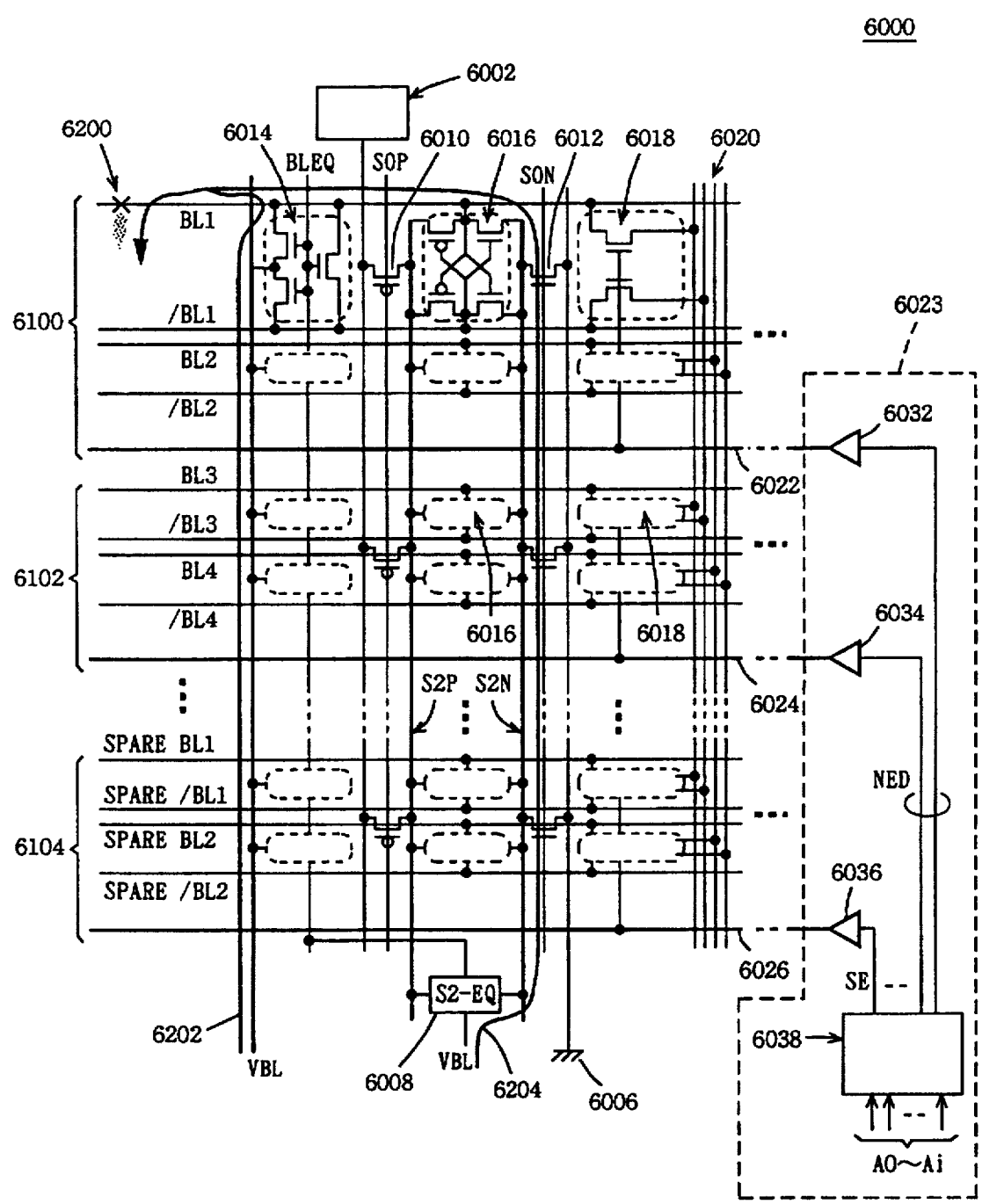
FIG. 12 is a schematic block diagram showing a structure of a first prior art DRAM.
Figure 13:
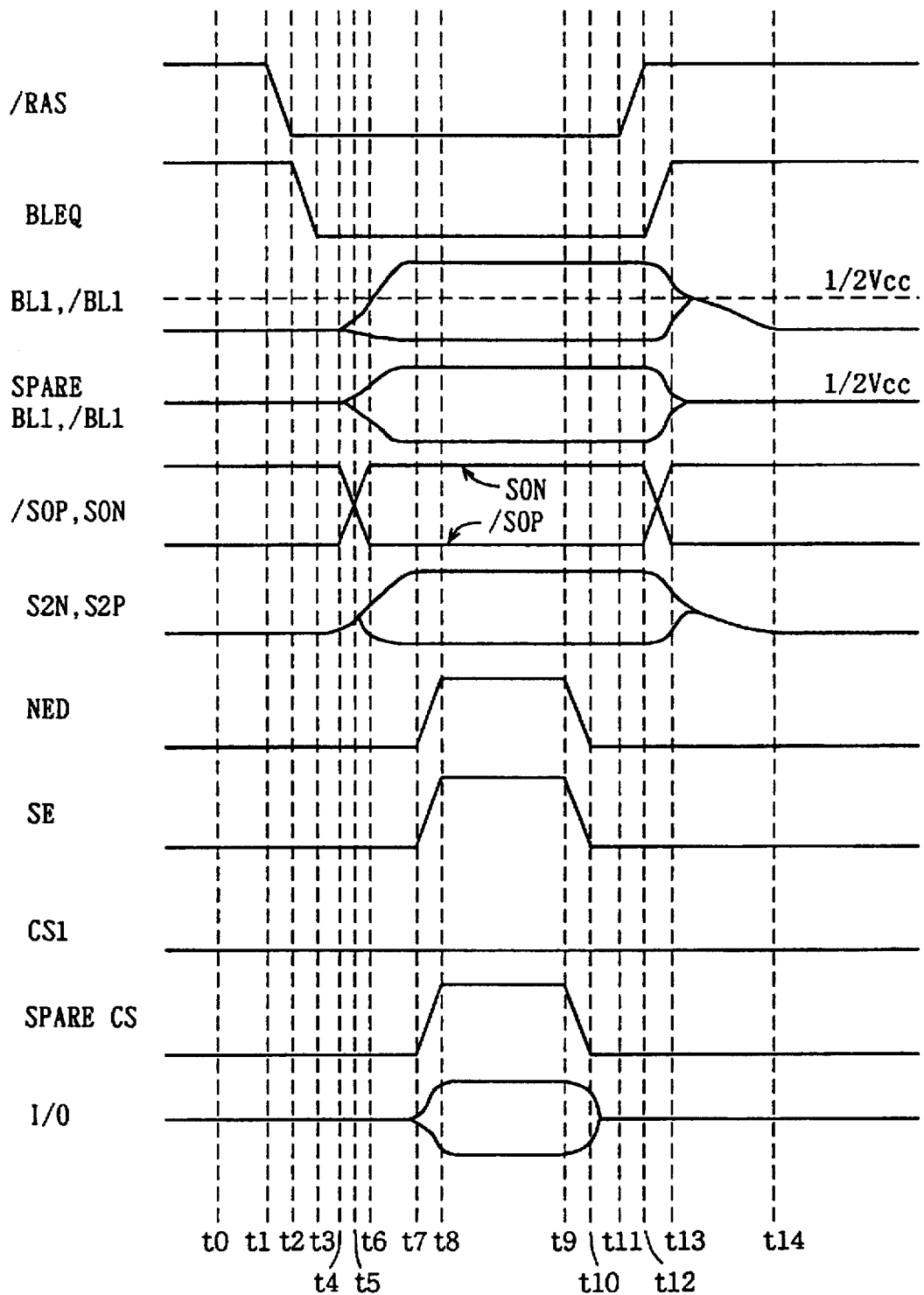
FIG. 13 is a timing chart illustrating the operation of the first prior art DRAM.
Figure 14:
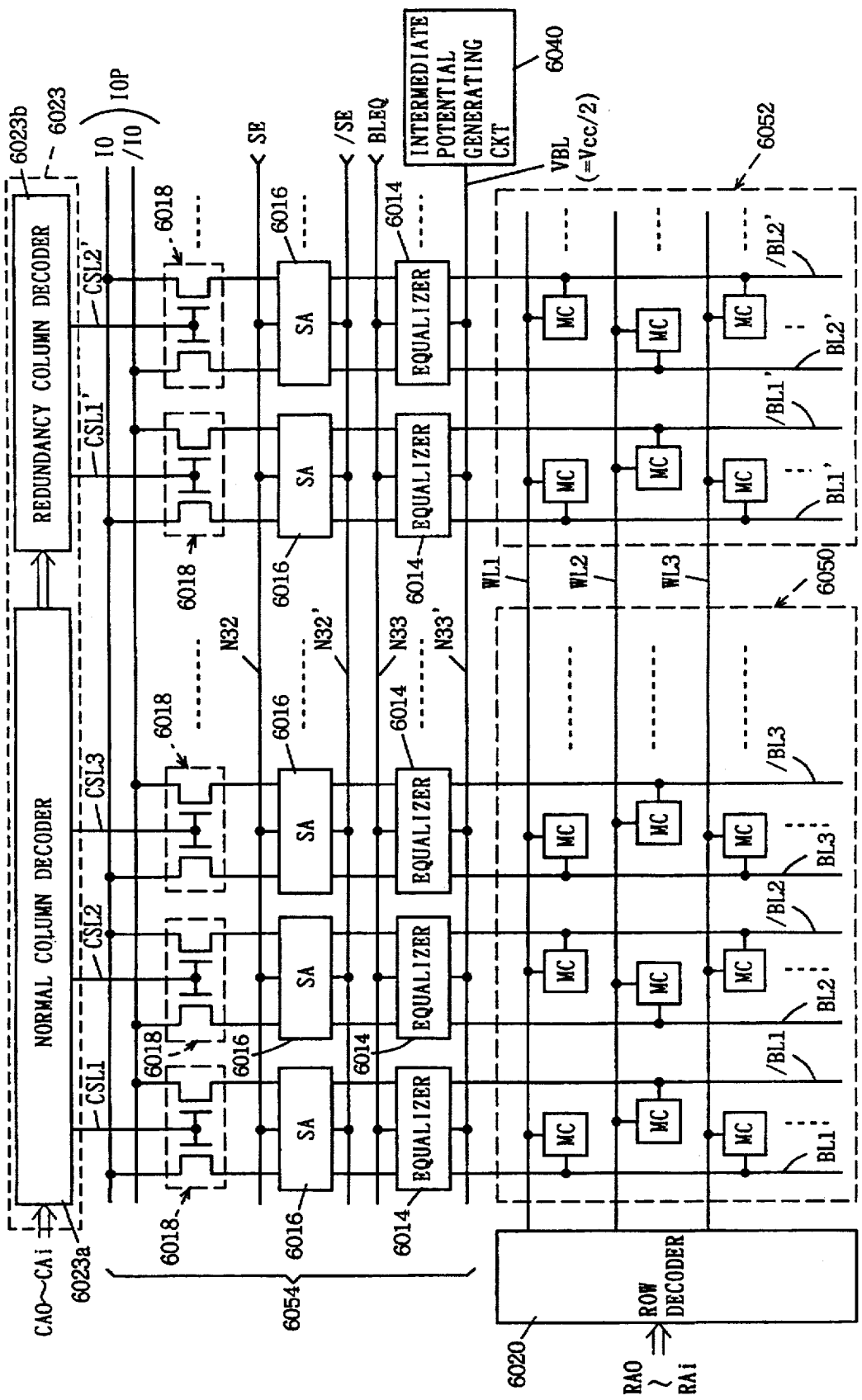
FIG. 14 is a schematic block diagram showing a part of the structure of the first prior art DRAM.
Figure 17:
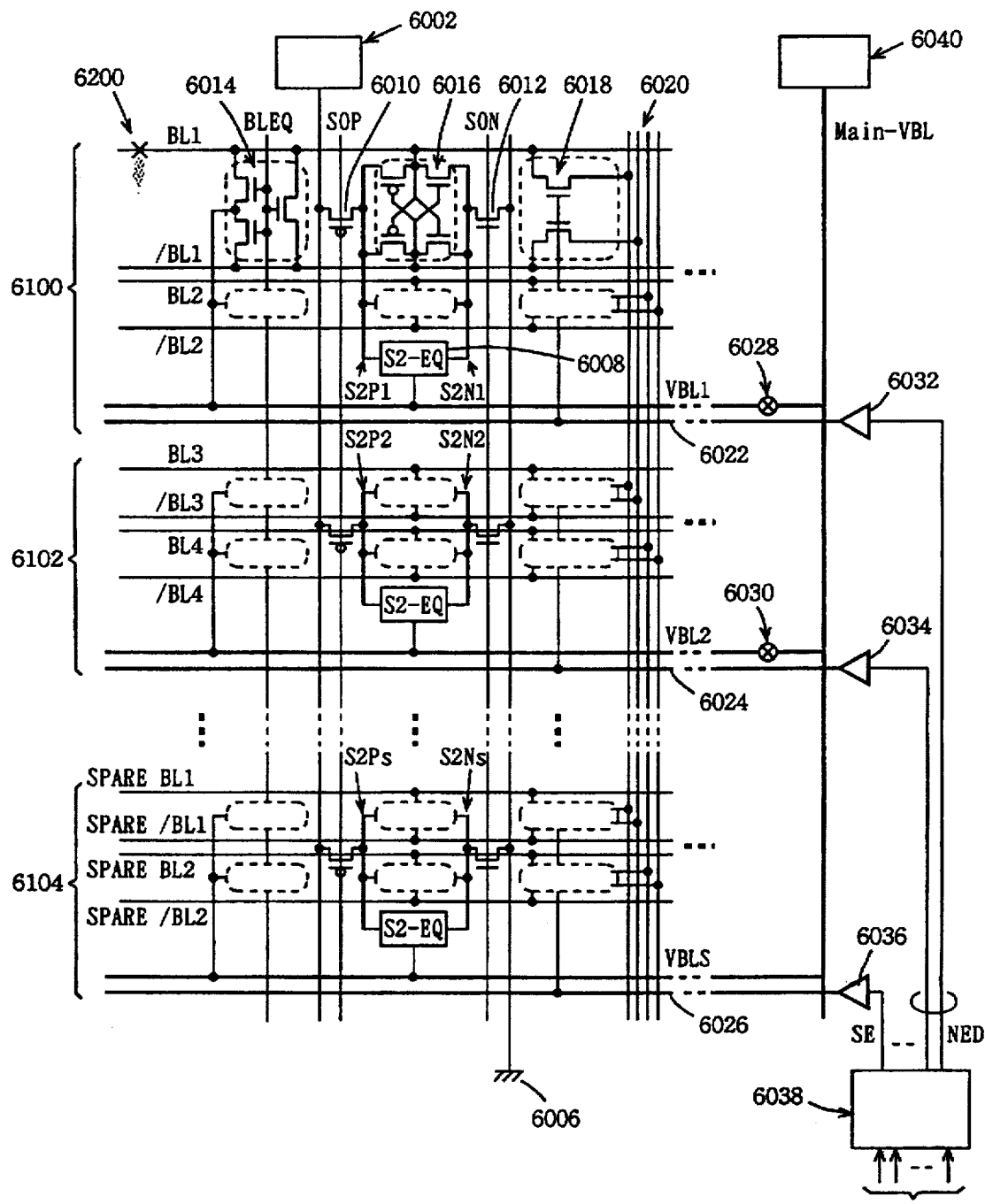
FIG. 17 is a schematic block diagram showing a structure of a second prior art DRAM.
Figure 18:
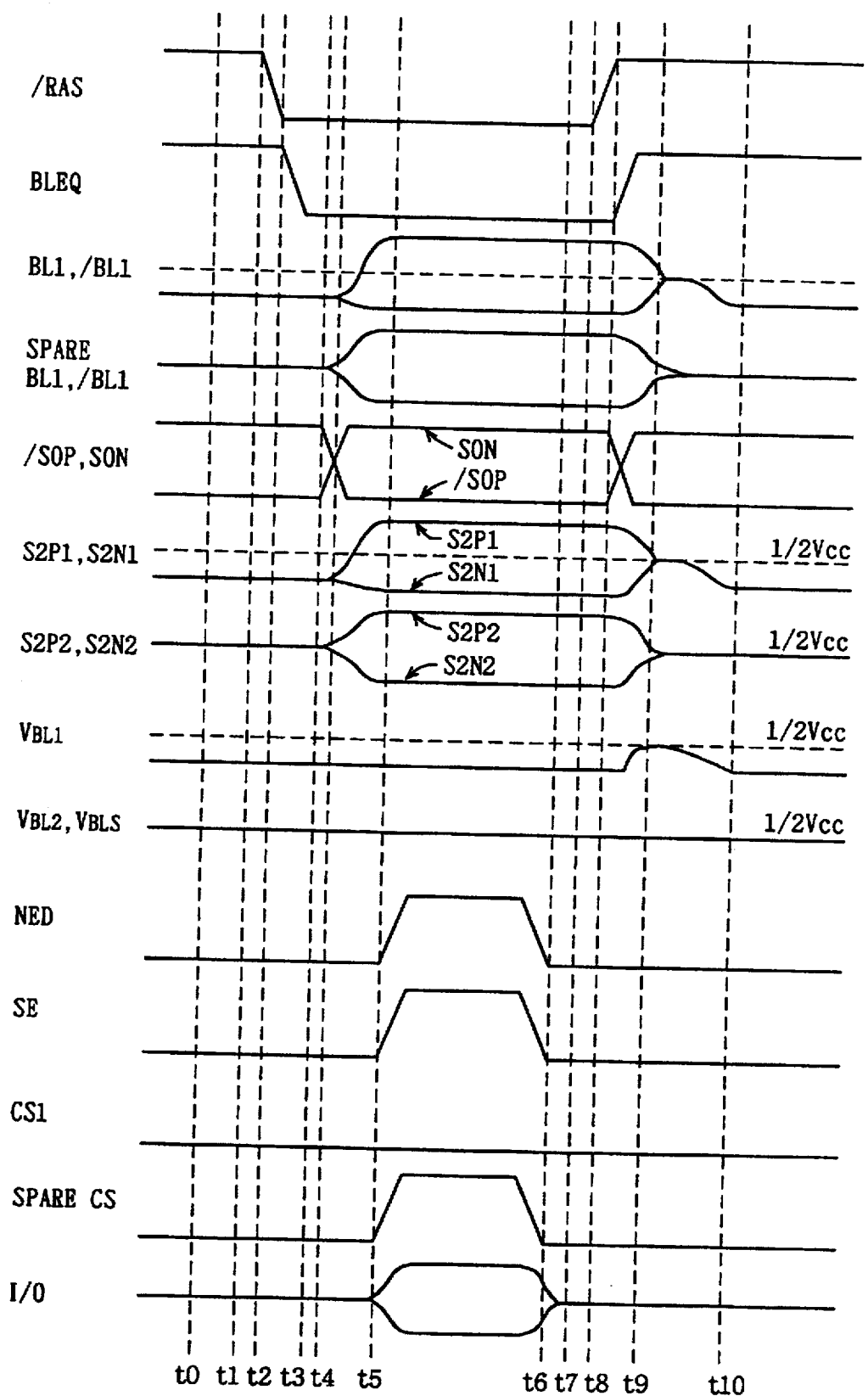
FIG. 18 is a timing chart illustrating operation of a second prior art DRAM.

FIG. 11 is a block diagram showing a structure of a DRAM 5000 in accordance with a second embodiment of the present invention, which corresponds to FIG. 17 showing the structure of a conventional DRAM.

The structure of the present embodiment differs from that of the structure of FIG. 17 in the following points.

First, for each block of columns of memory cells, a pass transistor 82 formed of an N channel MOS transistor is provided parallel to fuse element 80 which allows setting of connection between main bit line potential supplying interconnection MVBL and sub bit line potential supplying interconnection LVBL to the connected state or disconnected state.

Similar to DRAM 1000 in accordance with the first embodiment, in the period when the defective cell write mode is designated, pass transistor 82 is rendered conductive under the control of the signal TMS designating the defective cell write mode.

Second, as in DRAM 1000 in accordance with the first embodiment, clock generating circuit 1022 includes a mode setting circuit for activating the defective cell write mode designating signal TMS in accordance with the combination of external control signals EXT./WE, EXT./RAS and EXT./CAS, and for setting the level of signal SBVL in accordance with external control signal EXT./WE, EXT./RAS, EXT./CAS and signals A0 and A1.

Third, as in DRAM 1000 in accordance with the first embodiment, precharge potential generating circuit 1052 is adapted to supply potential at the high level or low level in accordance with the level of the signal SVBL while the signal TMS is active.

Fourth, fuse element 80 and pass transistor 82 are provided further corresponding to sub bit line potential supplying interconnection of spare column 6104 of memory cells.

Except these points, the structure is the same as that shown in FIG. 2. Therefore, corresponding portions are denoted by the same reference characters and description thereof is not repeated.

Therefore, in DRAM 5000 in accordance with the second embodiment having the above described structure, even when a column of memory cells in the memory cell array is replaced by a column of memory cells in the redundancy memory cell array on the block by block basis of columns of memory cells, it is possible in the period when the defective cell write mode is designated, to select word line of a memory cell array in accordance with a row address signal and to write simultaneously the data of the high level or low level supplied through a bit line from precharge potential generating circuit 1052 to memory cells connected to the selected word line, no matter whether the column of memory cells belongs to the memory cell array or to the redundancy memory cell array.

Though pass transistor 82 is formed of an N channel MOS transistor in the structure shown in FIG. 11, the structure of the present invention is not limited thereto.

When pass transistor 82 is formed of a P channel MOS transistor, it is possible to prevent, when data at the high level supplied through a bit line from precharge potential generating circuit 1052 is written simultaneously to memory cells connected to the selected word line, to prevent lowering of the potential level of the write data by the threshold voltage of the pass transistor.

When pass transistor 82 is formed of a transmission gate, it is possible when data at the high level or low level supplied through a bit line from precharge potential generating circuit 1052 is written simultaneously to memory cells connected to the selected word line, to prevent lowering of the potential level of the high level write data or increase in the potential level of the low level write data, by the threshold voltage of the pass transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a defective cell write mode, comprising:

a memory cell array including a plurality of memory cells arranged in a matrix of rows and columns;

a redundancy memory cell array including at least one column of memory cells to be substituted for by a column of memory cells including a defective memory cell, among the columns of memory cells of said memory cell array;

a plurality of word lines provided corresponding to respective rows of memory cells and common to said memory cell array and said redundancy memory cell array;

a plurality of bit line pairs provided corresponding to respective columns of memory cells;

internal potential generating means for generating an equalize potential for said bit line pairs, said internal potential generating means outputting the equalize potential of a first or second logic level in response to designation of said defective cell write mode;

potential supply control means for setting said bit line pairs and said internal potential generating means to a conductive state or disconnected state, said potential supply control means including first switch means capable of setting, in nonvolatile manner, a first connection path between said plurality of bit line pairs and said internal potential generating means either to a connected state or a disconnected state for each of said bit line pairs, and second switch means for setting a second connection path between said plurality of bit line pairs and said internal potential generating means to conductive state while said defective cell write mode is designated; and write means for selecting said word line in accordance with a row address signal, for writing a memory cell corresponding to said word line, said first or second logic level supplied through said bit line from said internal potential generating means, in a period when said defective cell write mode is designated.

2. The semiconductor memory device according to claim 1, wherein said write means simultaneously writes said first or second logic level supplied through said bit lines from said internal potential generating means to a plurality of memory cells corresponding to said selected word line.

3. The semiconductor memory device according to claim 1, wherein said first switch means includes a plurality of fuse elements provided between said bit line pairs and said internal potential generating means, respectively.

4. The semiconductor memory device according to claim 1, further comprising operation mode detecting means responsive to an external control signal for detecting designation of said first or second logic level to be written to said memory cell and designation of said defective cell write mode; wherein said internal potential generating means includes an output node to which said equalize potential is supplied, voltage dividing means for supplying to said output node a prescribed potential level intermediate between said first and second logic levels in a period when said defective cell write mode is not designated, and write potential setting means for supplying said first or second logic level designated in accordance with said external control signal, to said output node, under control by said operation mode detecting means in the period when said defective cell write mode is designated.

5. The semiconductor memory device according to claim 4, wherein said internal potential generating means further includes third switch means receiving an output from said voltage dividing means and an output from said write potential setting means for selectively applying one of the received outputs to said output node, dependent on whether said defective cell write mode is designated or not; and said write potential setting means includes first and second MOS transistors connected in series between a node to which said first logic level is supplied and a node to which said second logic level is supplied, selectively rendered conductive under the control by said operation mode detecting means, and potential at a point of connection between said first and second MOS transistors being applied to said third switch means.

6. The semiconductor memory device according to claim 4, wherein said second switch means includes a plurality of transmission gates provided between said bit line pairs and said internal potential generating means, respectively, and rendered conductive in the period when the defective cell write mode is designated, controlled by said operation mode detecting means.

7. A semiconductor memory device having a defective cell write mode, comprising:

a memory cell array including a plurality of memory cells arranged in a matrix of rows and column, said memory cell array being divided into a plurality of memory cell blocks by a unit of a prescribed number of columns of memory cell;

a redundancy memory cell array including at least one redundancy memory cell block to be substituted for a memory cell block including a defective memory cell among the memory cell blocks in said memory cell array;

a plurality of word lines provided corresponding to respective rows of memory cells and common to said memory cell array and said redundancy memory cell array;

a plurality of bit line pairs provided corresponding to respective columns of memory cells;

internal potential generating means for generating an equalize potential for said bit line pairs, said internal potential generating means outputting the equalize potential at a first or a second logic level, in response to designation of said defective cell write mode;

potential supply control means for setting said prescribed number of bit line pairs included in said memory cell block and said internal potential generating means to a conductive state or a disconnected state, said potential supply control means including a first switch means capable of setting, in nonvolatile manner, a first connection path between said prescribed number of bit line pairs included in said memory cell block and said internal potential generating means either to a connected state or the disconnected state on memory cell block by memory cell block basis, and second switch means for maintaining conductive a second connection path between said prescribed number of bit line pairs included in said memory cell block and said internal potential generating means in a period when said defective cell write mode is designated; and write means for selecting said word line in accordance with a row address signal for writing said first or second logic level supplied through said bit line pair from said internal potential generating means to a memory cell corresponding to said selected word line, in the period when said defective cell write mode is designated.

8. The semiconductor memory device according to claim 7, wherein said write means simultaneously writes said first or second logic level supplied through said bit lines from said internal potential generating means to a plurality of memory cells corresponding to said selected word line.

9. The semiconductor memory device according to claim 7, wherein said first switch means includes a plurality of fuse elements provided between said memory cell blocks and said internal potential generating means, respectively.

10. The semiconductor memory device according to claim 7 further comprising operation mode detecting means responsive to an external control signal for detecting designation of said defective cell write mode and designation of said first or second logic level to be written to said memory cell; wherein said internal potential generating means includes an output node to which said equalize potential is supplied, first voltage dividing means for supplying to said first output node a prescribed potential level intermediate between said first and second logic levels in a period when said defective cell write mode is not designated, and write potential setting means for supplying either said first or second logic level designated in accordance with said external control signal to said output node, controlled by said operation mode detecting means in the period when said defective cell write mode is designated.

11. The semiconductor memory device according to claim 10, wherein said internal potential generating means further includes third switch means receiving an output from said voltage dividing means and an output from said write potential setting means for selectively applying one of the received outputs to said output node dependent on whether the defective cell write mode is designated or not; and said write potential setting means includes first and second MOS transistors connected in series between a node to which said first logic level is supplied and a node to which said second logic level is supplied, and selectively rendered conductive under control by said operation mode detecting means, and potential at a point of connection between said first and second MOS transistors being applied to said third switching means.

12. The semiconductor memory device according to claim 10, wherein said second switch means includes a plurality of transmission gates provided between said memory cell blocks and said internal potential generating means, respectively, and rendered conductive in the period when the defective cell write mode is designated, controlled by said operation mode detecting means.

* * * * *

UNITED STATES PATENT AND TRADEMARK OFFICE
CERTIFICATE OF CORRECTION

PATENT NO.    :  5,896,328
DATED         :  April 20, 1999
INVENTOR(S)   :  Tetsushi TANIZAKI et al.

It is certified that error appears in the above-identified patent and that said Letter Patent is hereby corrected as shown below:

Column 20, line 28, delete "first" (both occurrences)

Signed and Sealed this

Fourteenth Day of December, 1999

*Attest:*

Q. TODD DICKINSON

*Attesting Officer*          *Acting Commissioner of Patents and Trademarks*